US009465297B2

(12) United States Patent
Fujimura et al.

(10) Patent No.: US 9,465,297 B2
(45) Date of Patent: *Oct. 11, 2016

(54) METHOD AND SYSTEM FOR FORMING PATTERNS WITH CHARGED PARTICLE BEAM LITHOGRAPHY

(71) Applicant: D2S, Inc., San Jose, CA (US)

(72) Inventors: Akira Fujimura, Saratoga, CA (US); Ingo Bork, Mountain View, CA (US)

(73) Assignee: D2S, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/715,136

(22) Filed: May 18, 2015

(65) Prior Publication Data

US 2015/0261907 A1    Sep. 17, 2015

Related U.S. Application Data

(63) Continuation of application No. 14/257,874, filed on Apr. 21, 2014, now Pat. No. 9,034,542, which is a continuation-in-part of application No. 13/168,953, filed on Jun. 25, 2011, now Pat. No. 8,703,389.

(51) Int. Cl.
| G03F 7/20 | (2006.01) |
| G03F 1/20 | (2012.01) |
| G03F 1/78 | (2012.01) |
| G06F 17/50 | (2006.01) |
| H01J 37/317 | (2006.01) |
| B82Y 10/00 | (2011.01) |
| B82Y 40/00 | (2011.01) |
| H01J 37/147 | (2006.01) |
| H01L 21/027 | (2006.01) |

(52) U.S. Cl.
CPC ............ G03F 7/2037 (2013.01); B82Y 10/00 (2013.01); B82Y 40/00 (2013.01); G03F 1/20 (2013.01); G03F 1/78 (2013.01); G03F 7/2063 (2013.01); G06F 17/5009 (2013.01); G06F 17/5081 (2013.01); H01J 37/147 (2013.01); H01J 37/3174 (2013.01); H01J 37/3175 (2013.01); H01J 2237/31764 (2013.01); H01J 2237/31771 (2013.01); H01J 2237/31776 (2013.01); H01L 21/027 (2013.01); Y10S 430/143 (2013.01)

(58) Field of Classification Search
CPC .......... G03F 1/20; G03F 7/2037; G03F 1/78; G03F 7/2063; H01L 21/027; Y10S 430/143; B82Y 10/00; B82Y 40/00; G06F 17/5081; G06F 17/5009; H01J 37/3174; H01J 37/147; H01J 37/3175; H01J 2237/31764; H01J 2237/31771; H01J 2237/31776
USPC ...................... 430/5, 30, 296, 942
See application file for complete search history.

(56) References Cited

U.S. PATENT DOCUMENTS

| 4,825,033 A | 4/1989 | Beasley |
| 5,103,101 A | 4/1992 | Berglund et al. |
| 5,173,582 A | 12/1992 | Sakamoto et al. |
| 5,334,282 A | 8/1994 | Nakayama et al. |
| 5,885,748 A | 3/1999 | Ohnuma |
| 6,037,601 A | 3/2000 | Okunuki |
| 6,218,671 B1 | 4/2001 | Gordon et al. |
| 6,372,391 B1 | 4/2002 | Wolfe et al. |
| 6,416,912 B1 | 7/2002 | Kobayashi et al. |
| 6,433,348 B1 | 8/2002 | Abboud et al. |
| 6,557,162 B1 | 4/2003 | Pierrat |
| 6,610,989 B1 | 8/2003 | Takahashi |
| 6,627,366 B2 | 9/2003 | Yang |
| 6,891,175 B2 | 5/2005 | Hiura |
| 6,917,048 B2 | 7/2005 | Fujiwara et al. |
| 7,536,664 B2 | 5/2009 | Cohn et al. |
| 7,703,069 B1 | 4/2010 | Liu et al. |
| 7,716,627 B1 | 5/2010 | Ungar et al. |
| 7,759,027 B2 | 7/2010 | Fujimura et al. |
| 7,799,489 B2 | 9/2010 | Fujimura et al. |
| 7,901,850 B2 | 3/2011 | Fujimura et al. |
| 8,137,871 B2 | 3/2012 | Zable et al. |
| 8,354,207 B2 | 1/2013 | Fujimura et al. |
| 8,473,875 B2 | 6/2013 | Fujimura et al. |

(Continued)

FOREIGN PATENT DOCUMENTS

| CN | 1193810 A | 9/1998 |
| EP | 1429368 A2 | 6/2004 |

(Continued)

OTHER PUBLICATIONS

International Search Report and Written Opinion dated Apr. 27, 2012 for PCT Application No. PCT/US2011/055535.
International Search Report and Written Opinion dated Apr. 30, 2012 for PCT Application No. PCT/US2011/055536.
International Search Report and Written Opinion dated Dec. 20, 2012 for PCT Application No. PCT/US2012/054526.
International Search Report and Written Opinion dated Jul. 24, 2013 for PCT Application No. PCT/US2013/036671.
International Search Report and Written Opinion dated Jul. 29, 2013 for PCT Application No. PCT/US2013/036669.
International Search Report and Written Opinion dated Sep. 13, 2012 for PCT Patent Application No. PCT/US2012/043042.

(Continued)

Primary Examiner — Christopher Young
(74) Attorney, Agent, or Firm — The Mueller Law Office, P.C.

(57) ABSTRACT

In a method for fracturing or mask data preparation or mask process correction for charged particle beam lithography, a plurality of shots are determined that will form a pattern on a surface, where shots are determined so as to reduce sensitivity of the resulting pattern to changes in beam blur ($\beta_f$). In some embodiments, the sensitivity to changes in $\beta_f$ is reduced by varying the charged particle surface dosage for a portion of the pattern. Methods for forming patterns on a surface, and for manufacturing an integrated circuit are also disclosed, in which pattern sensitivity to changes in $\beta_f$ is reduced.

12 Claims, 12 Drawing Sheets

(56) References Cited

U.S. PATENT DOCUMENTS

| | | |
|---|---|---|
| 8,703,389 B2 | 4/2014 | Fujimura et al. |
| 8,828,628 B2 | 9/2014 | Fujimura |
| 8,900,778 B2 | 12/2014 | Fujimura et al. |
| 9,034,542 B2 | 5/2015 | Fujimura et al. |
| 2002/0005494 A1 | 1/2002 | Kamijo et al. |
| 2002/0129328 A1 | 9/2002 | Komatsuda |
| 2002/0177056 A1 | 11/2002 | Ogino et al. |
| 2003/0043358 A1 | 3/2003 | Suganuma et al. |
| 2003/0044703 A1 | 3/2003 | Yamada |
| 2003/0077530 A1 | 4/2003 | Fujiwara et al. |
| 2003/0082461 A1 | 5/2003 | Carpi |
| 2003/0087191 A1 | 5/2003 | Lavallee et al. |
| 2003/0159125 A1 | 8/2003 | Wang et al. |
| 2003/0203287 A1 | 10/2003 | Miyagawa |
| 2004/0011966 A1 | 1/2004 | Sasaki et al. |
| 2004/0099636 A1 | 5/2004 | Scipioni |
| 2004/0131977 A1 | 7/2004 | Martyniuk et al. |
| 2005/0053850 A1 | 3/2005 | Askebjer et al. |
| 2005/0075819 A1 | 4/2005 | Paxton et al. |
| 2005/0076322 A1 | 4/2005 | Ye et al. |
| 2005/0097500 A1 | 5/2005 | Ye et al. |
| 2005/0211921 A1 | 9/2005 | Wieland et al. |
| 2005/0221204 A1 | 10/2005 | Kimura |
| 2005/0287451 A1 | 12/2005 | Hudek et al. |
| 2006/0085773 A1 | 4/2006 | Zhang |
| 2006/0126046 A1 | 6/2006 | Hansen |
| 2006/0218520 A1 | 9/2006 | Pierrat et al. |
| 2007/0114463 A1 | 5/2007 | Nakasugi et al. |
| 2007/0162889 A1 | 7/2007 | Broeke et al. |
| 2007/0196768 A1 | 8/2007 | Ogino |
| 2007/0280526 A1 | 12/2007 | Malik et al. |
| 2008/0050676 A1 | 2/2008 | Hoshino |
| 2008/0054196 A1 | 3/2008 | Hiroshima |
| 2008/0116398 A1 | 5/2008 | Hara et al. |
| 2008/0213677 A1 | 9/2008 | Saito |
| 2009/0325085 A1 | 12/2009 | Yoshida et al. |
| 2010/0055580 A1 | 3/2010 | Fujimura et al. |
| 2010/0055585 A1 | 3/2010 | Fujimura et al. |
| 2010/0058279 A1 | 3/2010 | Fujimura et al. |
| 2010/0058281 A1 | 3/2010 | Fujimura et al. |
| 2010/0058282 A1 | 3/2010 | Fujimura et al. |
| 2010/0148087 A1 | 6/2010 | Doering et al. |
| 2010/0183963 A1 | 7/2010 | Zable et al. |
| 2010/0209834 A1 | 8/2010 | Yao et al. |
| 2010/0251202 A1 | 9/2010 | Pierrat |
| 2010/0315611 A1 | 12/2010 | Kato |
| 2010/0325595 A1 | 12/2010 | Song et al. |
| 2011/0045409 A1 | 2/2011 | Fujimura |
| 2011/0053056 A1 | 3/2011 | Fujimura et al. |
| 2011/0053093 A1 | 3/2011 | Hagiwara et al. |
| 2011/0116067 A1 | 5/2011 | Ye et al. |
| 2011/0145769 A1 | 6/2011 | Wei |
| 2011/0159435 A1 | 6/2011 | Zable et al. |
| 2011/0177458 A1 | 7/2011 | Kotani et al. |
| 2011/0191727 A1 | 8/2011 | Fujimura et al. |
| 2012/0084740 A1 | 4/2012 | Fujimura et al. |
| 2012/0096412 A1 | 4/2012 | Fujimura et al. |
| 2012/0149133 A1 | 6/2012 | Parrish et al. |
| 2012/0217421 A1 | 8/2012 | Fujimura et al. |
| 2012/0329289 A1 | 12/2012 | Fujimura et al. |
| 2013/0070222 A1 | 3/2013 | Fujimura |
| 2013/0283216 A1 | 10/2013 | Pearman et al. |
| 2013/0283218 A1 | 10/2013 | Fujimura et al. |

FOREIGN PATENT DOCUMENTS

| | | |
|---|---|---|
| EP | 2302659 A2 | 3/2011 |
| GB | 2367908 | 4/2002 |
| JP | S5425675 A | 2/1979 |
| JP | S54025675 | 2/1979 |
| JP | S608844 A | 1/1985 |
| JP | 61105839 | 5/1986 |
| JP | 63007631 | 1/1988 |
| JP | H02280315 A | 11/1990 |
| JP | 03205815 | 9/1991 |
| JP | H03205815 A | 9/1991 |
| JP | 1992155337 | 5/1992 |
| JP | 04196516 | 7/1992 |
| JP | 4196516 A | 7/1992 |
| JP | H04196516 A | 7/1992 |
| JP | H04307723 A | 10/1992 |
| JP | 05036595 | 2/1993 |
| JP | H0536595 A | 2/1993 |
| JP | H05036595 | 2/1993 |
| JP | 05267133 | 10/1993 |
| JP | H05267133 A | 10/1993 |
| JP | H05335221 A | 12/1993 |
| JP | H0620931 A | 1/1994 |
| JP | H06020931 | 1/1994 |
| JP | 06124883 | 5/1994 |
| JP | 08055771 | 2/1996 |
| JP | 8555771 | 2/1996 |
| JP | H0855771 A | 2/1996 |
| JP | 08064522 | 3/1996 |
| JP | H08195339 A | 7/1996 |
| JP | 8222504 | 8/1996 |
| JP | H08222504 A | 8/1996 |
| JP | H09266153 A | 10/1997 |
| JP | 10294255 | 11/1998 |
| JP | H11111594 A | 4/1999 |
| JP | 11233401 | 8/1999 |
| JP | 2000012426 A | 1/2000 |
| JP | 2000066366 A | 3/2000 |
| JP | 2000091191 A | 3/2000 |
| JP | 2000123768 A | 4/2000 |
| JP | 2000138165 A | 5/2000 |
| JP | 2000269123 A | 9/2000 |
| JP | 2001013671 A | 1/2001 |
| JP | 2001093809 A | 4/2001 |
| JP | 2001203157 A | 7/2001 |
| JP | 2001230203 A | 8/2001 |
| JP | 2001305720 A | 11/2001 |
| JP | 2001313253 A | 11/2001 |
| JP | 2002008966 | 1/2002 |
| JP | 2002075830 A | 3/2002 |
| JP | 2002110508 A | 4/2002 |
| JP | 2002202590 A | 7/2002 |
| JP | 2002217092 A | 8/2002 |
| JP | 2003195511 A | 7/2003 |
| JP | 2003315976 A | 11/2003 |
| JP | 2003338460 A | 11/2003 |
| JP | 2003347192 A | 12/2003 |
| JP | 2004063546 | 2/2004 |
| JP | 2004088071 A | 3/2004 |
| JP | 2004134447 A | 4/2004 |
| JP | 2004170410 A | 6/2004 |
| JP | 2004273526 A | 9/2004 |
| JP | 2004304031 A | 10/2004 |
| JP | 2004356440 A | 12/2004 |
| JP | 2005079111 A | 3/2005 |
| JP | 2006032814 A | 2/2006 |
| JP | 2006100336 A | 4/2006 |
| JP | 2006108447 A | 4/2006 |
| JP | 2006294794 A | 10/2006 |
| JP | 2007041090 A | 2/2007 |
| JP | 2007249167 | 9/2007 |
| JP | 2007305880 A | 11/2007 |
| JP | 2008053565 A | 3/2008 |
| JP | 2008066441 A | 3/2008 |
| JP | 2008096486 A | 4/2008 |
| JP | 2009147254 A | 7/2009 |
| JP | 2010062562 A | 3/2010 |
| JP | 2011040716 A | 2/2011 |
| JP | 2011049556 | 3/2011 |
| KR | 20030091754 | 12/2003 |
| KR | 1020070082031 | 8/2007 |
| TW | 495834 B | 7/2002 |
| TW | I222100 B | 10/2004 |
| TW | I233149 B | 5/2005 |
| TW | 200604763 A | 2/2006 |
| TW | 200606602 | 2/2006 |
| TW | 200700932 | 1/2007 |
| TW | 200834366 A | 8/2008 |
| WO | 03036386 A | 5/2003 |

(56) References Cited

FOREIGN PATENT DOCUMENTS

| WO | 2007030528 A2 | 3/2007 |
| WO | 2008064155 A | 5/2008 |
| WO | 2010025031 A2 | 3/2010 |
| WO | 2010025032 A | 3/2010 |
| WO | 2010025060 A2 | 3/2010 |
| WO | 2011025795 A1 | 3/2011 |

OTHER PUBLICATIONS

Martin, L. et al., "Development of Multiple Pass Exposure in Electron Beam Direct Write Lithography for Sub-32nm Nodes", Proceedings of SPIE, vol. 7488 (Sep. 29, 2009), pp. 74881C-1-74881C-12, SPIE, P.O. Box 10, Bellingham, WA. 98227, U.S.A.
Martin, L. et al., "New Writing Strategy in Electron Beam Direct Write Lithography to Improve Critical Dense Lines Patterning for Sub-45nm Nodes", Proceedings of SPIE, vol. 7470 (Jan. 29, 2009), pp. 74700R-1-74700R-12, SPIE, P.O. Box 10, Bellingham, WA. 98227, U.S.A.
Notice of Allowance and Fees dated Aug. 1, 2014 for U.S. Appl. No. 14/108,135.
Notice of Allowance and Fees dated Aug. 15, 2014 for U.S. Appl. No. 13/959,530.
Notice of Allowance and Fees dated Aug. 21, 2013 for U.S. Appl. No. 13/924,019.
Notice of Allowance and Fees dated Jan. 21, 2015 for U.S. Appl. No. 14/257,874.
Notice of Allowance and Fees dated Jul. 23, 2014 for U.S. Appl. No. 13/970,465.
Notice of Allowance and Fees dated Nov. 25, 2013 for U.S. Appl. No. 13/168,953.
Notice of Allowance and Fees dated Oct. 10, 2014 for U.S. Appl. No. 13/801,554.
Notice of Allowance and Fees dated Sep. 30, 2013 for U.S. Appl. No. 13/269,618.
Notice of Allowance and Fees due dated Mar. 6, 2013 for U.S. Appl. No. 13/168,954.
Office Action dated Apr. 15, 2014 for Japanese Patent Application No. 2011-525072.
Office Action dated Apr. 3, 2014 for Chinese patent application No. 200980134188.6.
Office Action dated Apr. 8, 2014 for Japanese Patent Application No. 2011-525091.
Office Action dated Aug. 30, 2013 for U.S. Appl. No. 13/236,610.
Office Action dated Aug. 5, 2014 for Japanese Patent Application No. 2011-525091.
Office Action dated Dec. 16, 2014 for U.S. Appl. No. 13/948,725.
Office Action dated Dec. 24, 2012 for U.S. Appl. No. 13/168,954.
Office Action dated Jul. 10, 2012 for U.S. Appl. No. 13/168,954.
Office Action dated Jul. 15, 2014 for U.S. Appl. No. 13/037,270.
Office Action dated Jul. 8, 2014 for Japanese Patent Application No. 2009-200191.
Office Action dated Jun. 3, 2014 for Japanese Patent Application No. 2012-526931.
Office Action dated Jun. 10, 2014 for Japanese Patent Application No. 2011-525090.
Office Action dated Jun. 10, 2014 for JP Patent Application No. 2011-525073.
Office Action dated Jun. 3, 2014 for Japanese Patent Application No. 2012-535220.
Office Action dated Jun. 6, 2014 for U.S. Appl. No. 13/329,315.
Office Action dated May 9, 2013 for U.S. Appl. No. 13/269,618.
Office Action dated May 9, 2014 for U.S. Appl. No. 14/106,584.
Office Action dated May 1, 2014 for U.S. Appl. No. 13/862,471.
Office Action dated May 13, 2014 for Japanese Patent Application No. 2010-183857.
Office Action dated May 16, 2014 for U.S. Appl. No. 13/948,725.
Office Action dated May 27, 2014 for Japanese Patent Application No. 2012-535223.
Office Action dated May 5, 2014 for U.S. Appl. No. 13/862,475.
Office Action dated Nov. 11, 2014 for Japanese Patent Application No. 2012-526931.
Office Action dated Oct. 1, 2013 for U.S. Appl. No. 13/862,475.
Office Action dated Oct. 15, 2014 for U.S. Appl. No. 13/862,476.
Office Action dated Oct. 20, 2014 for U.S. Appl. No. 13/862,471.
Office Action dated Oct. 24, 2014 for U.S. Appl. No. 14/106,584.
Office Action dated Oct. 6, 2014 for U.S. Appl. No. 14/331,008.
Official Letter and Search Report dated Aug. 21, 2014 for Taiwanese Patent Application No. 098128359.
Official letter and search report dated Aug. 6, 2014 for Taiwanese Patent Application No. 099127553.
Official Letter and Search Report dated Oct. 24, 2014 for Taiwanese Patent Application No. 099134187.
Official Letter and Search Report dated Sep. 25, 2014 for Taiwanese Patent Application No. 099134186.
Official Letter and Search Report dated Sep. 25, 2014 for Taiwanese Patent Application No. 98128360.
Search Report dated Apr. 9, 2014 for Taiwanese Application No. 98128358.
Notice of Allowance and Fees dated Feb. 9, 2015 for U.S. Appl. No. 13/037,270.
Notice of Allowance and Fees dated Jan. 23, 2015 for U.S. Appl. No. 13/862,476.
Notice of Allowance and Fees dated Jan. 26, 2015 for U.S. Appl. No. 14/106,584.
Notice of Allowance and Fees dated Mar. 27, 2015 for U.S. Appl. No. 13/948,725.
Notice of Allowance dated Jul. 12, 2011 for U.S. Appl. No. 12/750,709.
Office Action dated Feb. 6, 2015 for U.S. Appl. No. 13/862,475.
Office Action dated Jan. 20, 2015 for Japanese Patent Application No. 2012-535223.
Office Action dated Jan. 6, 2015 for Japanese Patent Application No. 2010-183857.
Office Action dated Mar. 27, 2015 for U.S. Appl. No. 14/454,140.
Office Action dated Mar. 3, 2015 for Japanese Patent Application No. 2011-525090.
Office Action dated May 12, 2015 for Korean Patent Application No. 10-2014-7036547.
Official letter and search report dated Apr. 29, 2015 for Taiwanese Application No. 99127100.
Extended European Search Report dated Jul. 20, 2015 for European Patent Application No. 12833285.5.
Extended European Search Report dated Jul. 23, 2015 for European Patent Application No. 12804558.0.
Hagiwara et al., Model-Based Mask Data Preparation (MB-MDP) for ArF and EUV Mask Process Correction, Photomask and Next-Generation Lithography Mask Technology XVIII, SPIE, vol. 8081, No. 1, Apr. 2011, pp. 1-8.
Notice of Allowance and Fees dated Jun. 23, 2015 for U.S. Appl. No. 14/578,060.
Office Action dated Aug. 18, 2015 for Japanese Patent Application No. 2014-248818.
Office Action dated Aug. 20, 2015 for U.S. Appl. No. 13/862,475.
Office Action dated Jul. 27, 2015 for U.S. Appl. No. 14/331,008.
Office Action dated Jul. 8, 2015 for U.S. Appl. No. 14/479,520.
Office Action dated Jun. 15, 2015 for U.S. Appl. No. 14/578,410.
Office Action dated Jun. 19, 2015 for U.S. Appl. No. 13/862,471.
Office Action dated Jun. 25, 2015 for U.S. Appl. No. 14/552,360.
Pierrat et al, Mask Data Correction Methodology in the Context of Model-Based Fracturing and Advanced Mask Models, Optical Microlithography XXIV, SPIE, vol. 7973, No. 1, Mar. 2011, pp. 1-11.
Notice of Allowance dated Feb. 22, 2016 for U.S. Appl. No. 14/809,188.
Notice of Allowance dated Jan. 25, 2016 for U.S. Appl. No. 14/177,688.
Notice of Allowance mailed Jan. 20, 2016 for U.S. Appl. No. 14/331,008.
Office Action dated Feb. 11, 2016 for U.S. Appl. No. 13/862,471.
Office Action dated Feb. 11, 2016 for U.S. Appl. No. 14/970,505.

(56) References Cited

OTHER PUBLICATIONS

Office Action dated Jan. 15, 2016 for Republic of Korea Patent Application No. 10-2009-0081187.
Search Report dated Dec. 24, 2015 for Taiwanese Patent Application No. 101134276.
Notice of Allowance dated Dec. 24, 2015 for U.S. Appl. No. 14/177,679.
Office Action dated Dec. 16, 2015 for Republic of Korea Patent Application No. 10-2011-7007511.
Office Action dated Dec. 21, 2015 for Republic of Korea Patent Application No. 10-2014-7036547.
Office Action dated Jan. 11, 2016 for Republic of Korea Patent Application No. 10-2011-7007654.
Official Letter and Search Report dated Oct. 21, 2015 for Taiwanese Patent Application 101122222.
European Search Report dated Nov. 17, 2015 for EP Patent Application No. 09810441.7.
Notice of Allowance and Fees dated Oct. 14, 2015 for U.S Appl. No. 14/552,360.
Notice of Allowance dated Oct. 23, 2015 for U.S. Appl. No. 14/479,520.
Office Action dated Oct. 20, 2015 for U.S. Appl. No. 14/454,140.
Office Action dated Oct. 6, 2015 for Japanese Patent Application No. 2013-556643.
Office Action dated Sep. 11, 2015 for U.S. Appl. No. 14/739,989.
Office Action dated Sep. 11, 2015 for U.S. Appl. No. 14/177,688.
Office Action dated Sep. 15, 2015 for Japanese Patent Application No. 2014-245829.
Office Action dated Sep. 21, 2015 for U.S. Appl. No. 14/177,679.
Quickle et al., Spot Overlap in a Variable Shaped Shpot Electroni Beam Exposure Tool, IP.com Journal, IP.com Inc., West Henrietta, NY, USA, Jun. 1, 1981 pp. 1-3.
Sakakibara et al., Variable-shaped Electron-Beam Direct Writing Technology for 1-Mum VSI Fabrication, IEEE Transations on Electron Devices, IEEE Service Center, New Jersey, US, vol. 28, No. 11, Nov. 1, 1981, pp. 1279-1284.
Leunissen et al., "Experimental and simulation comparison of electron-beam proximity correction". Journal of Vacuum Science & Technology B 22(6), Nov. 2004, pp. 2943-2947.
Notice of Allowance dated Mar. 18, 2016 for U.S. Appl. No. 13/862,475.
Notice of Allowance dated May 24, 2016 for U.S. Appl. No. 14/970,505.
Office Action dated Apr. 22, 2016 for U.S. Appl. No. 14/454,140.
Office Action dated Apr. 26, 2016 for Japanese Patent Application No. 2014-517074.
Office Action dated May 1, 2016 for Republic of Korea Patent Application No. 10-2010-0083145.
Office Action dated May 24, 2016 for U.S. Appl. No. 13/894,349.
Office Action dated May 3, 2016 for U.S. Appl. No. 15/068,516.
Pierrat and Bork, Impact of Model-Based Fracturing on E-beam Proximity Effect Correction Methodology, Proc. of SPIE vol. 7823, 782313, Sep. 2010 SPIE, 11 pages.

METHOD AND SYSTEM FOR FORMING PATTERNS WITH CHARGED PARTICLE BEAM LITHOGRAPHY

RELATED APPLICATIONS

This application is a continuation of U.S. patent application Ser. No. 14/257,874 filed on Apr. 21, 2014, entitled "Method and System For Forming Patterns With Charged Particle Beam Lithography", and issued on May 19, 2015 as U.S. Pat. No. 9,034,542; which is a continuation-in-part of U.S. patent application Ser. No. 13/168,953 filed on Jun. 25, 2011 entitled "Method and System For Forming Patterns With Charged Particle Beam Lithography", and issued as U.S. Pat. No. 8,703,389 on Apr. 22, 2014; which is related to U.S. patent application Ser. No. 13/168,954 filed on Jun. 25, 2011 entitled "Method and System for Forming High Accuracy Patterns Using Charged Particle Beam Lithography"; all of which are hereby incorporated by reference for all purposes.

BACKGROUND OF THE DISCLOSURE

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit (I.C.). Other substrates could include flat panel displays, holographic masks, or even other reticles. While conventional optical lithography uses a light source having a wavelength of 193 nm, extreme ultraviolet (EUV) or X-ray lithography are also considered types of optical lithography in this application. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels, holograms, directed self-assembly (DSA) guard bands, or magnetic recording heads. Conventional optical lithography writing machines typically reduce the photomask pattern by a factor of four during the optical lithographic process. Therefore, patterns formed on the reticle or mask must be four times larger than the size of the desired pattern on the substrate or wafer.

In the production or manufacturing of semiconductor devices, such as integrated circuits, non-optical methods may be used to transfer a pattern on a lithographic mask to a substrate such as a silicon wafer. Nanoimprint lithography (NIL) is an example of a non-optical lithography process. In nanoimprint lithography, a lithographic mask pattern is transferred to a surface through contact of the lithography mask with the surface.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical or non-optical lithography while others may be written using maskless direct write to fabricate the same substrate. Also, some patterns of a given layer may be written using optical or non-optical lithography, and other patterns written using maskless direct write. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels, holograms, or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane (i.e. of "Manhattan" orientation), and 45 degree right triangles (i.e. triangles with their three internal angles being 45 degrees, 45 degrees, and 90 degrees) of certain minimum and maximum sizes. At predetermined locations, doses of electrons are shot into the resist with these simple shapes. The total writing time for this type of system increases with the number of shots. In character projection (CP), there is a stencil in the system that has in it a variety of apertures or characters which may be complex shapes such as rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 degree triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection. Shaped beam charged particle beam lithography may use either a single shaped beam, or may use a plurality of shaped beams simultaneously exposing the surface, the plurality of shaped beams producing a higher writing speed than a single shaped beam.

As indicated, in lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in conventional optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on an interior or exterior corner of a pattern to sharpen the corner in the final transferred image. It is often the case that the precision demanded of the surface manufacturing process for SRAFs is less than the precision demanded for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations such as corner rounding will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask. As process nodes continue to shrink, the size of the smallest SRAFs on a photomask also shrinks. For example, at the 20 nm logic process node, 40 nm to 60 nm SRAFs are needed on the mask for the highest precision layers.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the substrate as input. ILT-computed reticle patterns may be purely curvilinear—i.e. completely non-rectilinear—and may include circular, nearly circular, annular, nearly annular, oval and/or nearly oval patterns. Since these ideal ILT curvilinear patterns are difficult and expensive to form on a reticle using conventional techniques, rectilinear approximations or rectilinearizations of the curvilinear patterns may be used. The rectilinear approximations decrease accuracy, however, compared to the ideal ILT curvilinear patterns. Additionally, if the rectilinear approximations are produced from the ideal ILT curvilinear patterns, the overall calculation time is increased compared to ideal ILT curvilinear patterns. In this disclosure ILT, OPC, source mask optimization (SMO), and computational lithography are terms that are used interchangeably.

EUV optical lithography has a much higher resolution than conventional optical lithography. The very high resolution of EUV significantly reduces the need for OPC processing, resulting in lower mask complexity for EUV than for 193 nm optical lithography. However, because of the very high resolution of EUV, imperfections in a photomask, such as excessive line edge roughness (LER), will be transferred to the wafer. Therefore, the accuracy requirements for EUV masks are higher than those for conventional optical lithography. Additionally, even though EUV mask shapes are not complicated by the addition of complex SRAFs or serifs required for conventional 193 nm lithography, EUV mask shapes are complicated by an addition of some complexities unique to EUV manufacturing. Of particular relevance in writing patterns on masks for EUV lithography is mid-range scattering of charged particles such as electrons, which may affect a radius of about 2 um. This midrange scattering introduces a new consideration for mask data preparation, because for the first time the influence from neighboring patterns has significant impact on the shape that a particular pattern would cast onto the mask surface. Previously, when exposing masks for use with conventional 193 nm lithography, the short-range scattering affected only the pattern being written, and the long-range scattering had a large enough effective range that only the size of a pattern, and not its detailed shape, was affected, making it possible to make corrections by only using dose modulation. In addition, since EUV processing of wafers is more expensive, it is desirable to reduce or eliminate multiple patterning. Multiple patterning is used in conventional optical lithography to allow exposure of small features by exposing patterns for one layer of wafer processing using multiple masks, each of which contains a portion of the layer pattern. Reducing or eliminating multiple exposures requires the single mask to contain more fine patterns. For example, a series of collinear line segments maybe double-patterned by first drawing a long line, then cutting the line into line segments by a second mask in conventional lithography. The same layer written with a single mask, such as for EUV lithography, would require a mask containing many smaller line segments. The need to write larger numbers of finer patterns on a single mask, each pattern needing to be more accurate, increases the need for precision on EUV masks.

There are a number of technologies used for forming patterns on a reticle, including using optical lithography or charged particle beam lithography. The most commonly used system is the variable shaped beam (VSB), where, as described above, doses of electrons with simple shapes such as Manhattan rectangles and 45-degree right triangles expose a resist-coated reticle surface. In conventional mask writing, the doses or shots of electrons are designed to avoid overlap wherever possible, so as to greatly simplify calculation of how the resist on the reticle will register the pattern. Similarly, the set of shots is designed so as to completely cover the pattern area that is to be formed on the reticle. U.S. Pat. No. 7,754,401, owned by the assignee of the present patent application and incorporated by reference for all purposes, discloses a method of mask writing in which intentional shot overlap for writing patterns is used. When overlapping shots are used, charged particle beam simulation can be used to determine the pattern that the resist on the reticle will register. Use of overlapping shots may allow patterns to be written with reduced shot count or higher accuracy or both. U.S. Pat. No. 7,754,401 also discloses use of dose modulation, where the assigned dosages of shots vary with respect to the dosages of other shots. The term model-based fracturing is used to describe the process of determining shots using the techniques of U.S. Pat. No. 7,754,401.

Reticle writing for the most advanced technology nodes typically involves multiple passes of charged particle beam writing, a process called multi-pass exposure, whereby the given shape on the reticle is written and overwritten. Typically, two to four passes are used to write a reticle to average out precision errors in the charged particle beam writer, allowing the creation of more accurate photomasks. Also typically, the list of shots, including the dosages, is the same for every pass. In one variation of multi-pass exposure, the lists of shots may vary among exposure passes, but the union of the shots in any exposure pass covers the same area. Multi-pass writing can reduce over-heating of the resist coating the surface. Multi-pass writing also averages out random errors of the charged particle beam writer. Multi-pass writing using different shot lists for different exposure passes can also reduce the effects of certain systemic errors in the writing process.

Current optical lithography writing machines typically reduce the photomask pattern by a factor of four during the optical lithographic process. Therefore, patterns formed on a reticle or mask must be four times larger than the size of the desired pattern on the substrate or wafer.

Manufacturing variations can cause variation in the size and shape of a pattern manufactured on a surface such as a wafer or reticle using a given set of charged particle beam lithography shots. Manufacturing variations may, for example, cause variation in critical dimensions (CD) of the manufactured pattern. Sources of this manufacturing variation include variation in particle beam intensity, unintended variation in exposure time and variation in resist sensitivity. The term dose margin describes the tolerance of a pattern defined by a set of charged particle beam shots to dosage-related manufacturing variations. A higher dose margin indicates a higher tolerance.

Dose margin is a typical measure for manufacturing tolerance. But there are other sources of manufacturing variation. In a world where overlapped or dose-modulated shots are used, sensitivity to beam blur or $\beta_f$, which includes the physical effects of forward scattering, Coulomb effect and resist diffusion, can also be an issue.

SUMMARY OF THE DISCLOSURE

A method for fracturing or mask data preparation or mask process correction for charged particle beam lithography is disclosed in which a plurality of shots are determined that will form a pattern on a surface, where shots are determined so as to reduce sensitivity of the resulting pattern to changes in $\beta_f$. In some embodiments, the sensitivity to changes in $\beta_f$ is reduced by varying the charged particle surface dosage for a portion of the pattern.

Methods for forming patterns on a surface, and for manufacturing an integrated circuit are also disclosed, in which pattern sensitivity to changes in $\beta_f$ is reduced.

DETAILED DESCRIPTION OF THE EMBODIMENTS

The present disclosure is related to lithography, and more particularly to the design and manufacture of a surface which may be a reticle, a wafer, or any other surface, using charged particle beam lithography.

The improvements and advantages of the present disclosure can be accomplished by controlling the parameters of the shots forming a pattern, so as to reduce the magnitude of pattern variations caused by variation of $\beta_f$, thereby allowing higher quality patterns to be formed on reticles and other surfaces such as wafers. In some embodiments, shot dosage, including multi-beam shot beamlet dosage, is varied to reduce sensitivity to changes in $\beta_f$. In other embodiments, the amount of shot overlap in a plurality of shots may be controlled, either during initial shot determination, or in a post-processing step, to reduce sensitivity to changes in $\beta_f$. In some embodiments, the sensitivity comprises pattern area sensitivity of the pattern formed on the surface. The reduced sensitivity to changes in $\beta_f$ expands the process window for the charged particle beam lithography process.

Figure 1:
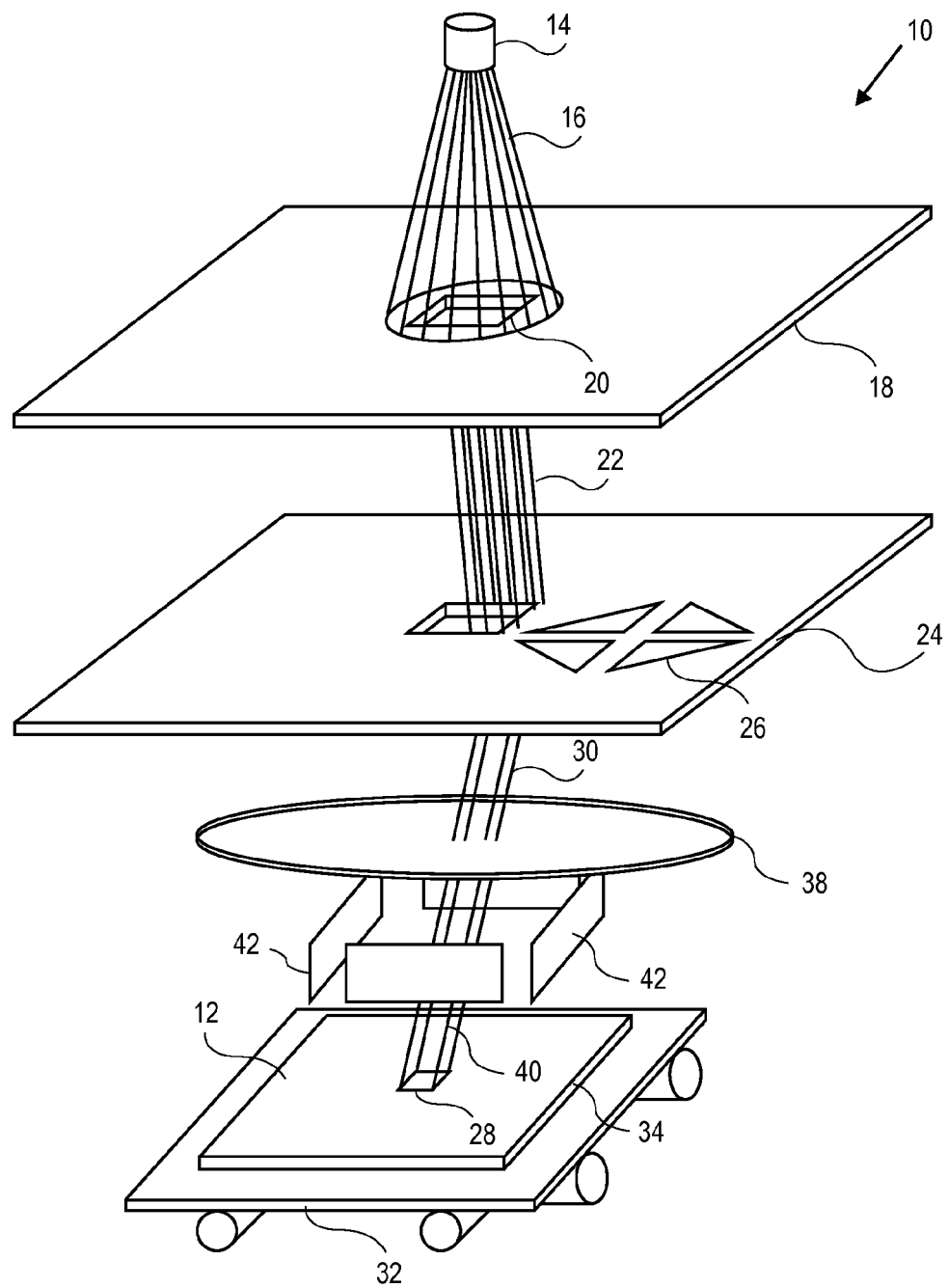
FIG. 1 illustrates an example of a charged particle beam system.

Referring now to the drawings, wherein like numbers refer to like items, FIG. 1 illustrates an embodiment of a lithography system, such as a charged particle beam writer system, in this case an electron beam writer system 10, that employs a variable shaped beam (VSB) to manufacture a surface 12. The electron beam writer system 10 has an electron beam source 14 that projects an electron beam 16 toward an aperture plate 18. The plate 18 has an aperture 20 formed therein which allows the electron beam 16 to pass. Once the electron beam 16 passes through the aperture 20 it is directed or deflected by a system of lenses (not shown) as electron beam 22 toward another rectangular aperture plate or stencil mask 24. The stencil 24 has formed therein a number of openings or apertures 26 that define various simple shapes such as rectangles and triangles. Each aperture 26 formed in the stencil 24 may be used to form a pattern in the surface 12 of a substrate 34, such as a silicon wafer, a reticle or other substrate. An electron beam 30 emerges from one of the apertures 26 and passes through an electromagnetic or electrostatic reduction lens 38, which reduces the size of the pattern emerging from the aperture 26. In commonly available charged particle beam writer systems, the reduction factor is between 10 and 60. The reduced electron beam 40 emerges from the reduction lens 38 and is directed by a series of deflectors 42 onto the surface 12 as a pattern 28. The surface 12 is coated with resist (not shown) which reacts with the electron beam 40. The electron beam 22 may be directed to overlap a variable portion of an aperture 26, affecting the size and shape of the pattern 28. Blanking plates (not shown) are used to deflect the beam 16 or the shaped beam 22 so to prevent the electron beam from reaching the surface 12 during a period after each shot when the lenses directing the beam 22 and the deflectors 42 are being re-adjusted for the succeeding shot. Typically the blanking plates are positioned so as to deflect the electron beam 16 to prevent it from illuminating aperture 20. Conventionally, the blanking period may be a fixed length of time, or it may vary depending, for example, on how much the deflector 42 must be re-adjusted for the position of the succeeding shot.

In electron beam writer system 10, the substrate 34 is mounted on a movable platform or stage 32. The stage 32 allows substrate 34 to be repositioned so that patterns which are larger than the maximum deflection capability or field size of the charged particle beam 40 may be written to surface 12 in a series of subfields, where each subfield is within the capability of deflector 42 to deflect the beam 40. In one embodiment the substrate 34 may be a reticle. In this embodiment, the reticle, after being exposed with the pattern, undergoes various manufacturing steps through which it becomes a lithographic mask or photomask. The mask may then be used in an optical lithography machine to project an image of the reticle pattern 28, generally reduced in size, onto a silicon wafer to produce an integrated circuit. More generally, the mask is used in another device or machine to transfer the pattern 28 on to a substrate (not illustrated).

Figure 2:
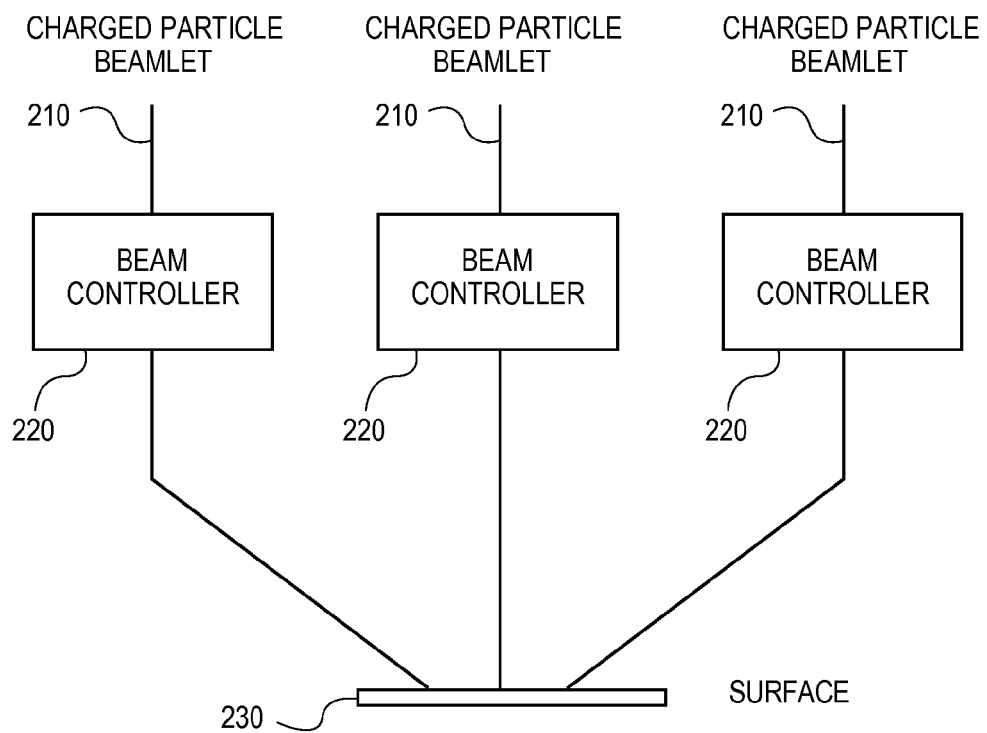
FIG. 2 illustrates an example of an electro-optical schematic diagram of a multi-beam exposure system.

A charged particle beam system may expose a surface with a plurality of individually-controllable beams or beamlets. FIG. 2 illustrates an electro-optical schematic diagram in which there are three charged particle beamlets 210. Associated with each beamlet 210 is a beam controller 220. Each beam controller 220 can, for example, allow its associated beamlet 210 to strike surface 230, and can also prevent beamlet 210 from striking the surface 230. In some embodiments, beam controller 220 may also control beam blur, magnification, size and/or shape of beamlet 210. In this disclosure, a charged particle beam system which has a plurality of individually-controllable beamlets is called a multi-beam system. In some embodiments, charged particles from a single source may be sub-divided to form a plurality of beamlets 210. In other embodiments a plurality of sources may be used to create the plurality of beamlets 210. In some embodiments, beamlets 210 may be shaped by one or more apertures, whereas in other embodiments there may be no apertures to shape the beamlets. Each beam controller 220 may allow the period of exposure of its associated beamlet to be controlled individually. Generally the beamlets will be reduced in size by one or more lenses (not shown) before striking the surface 230, which will typically be coated with a resist. In some embodiments each beamlet may have a separate electro-optical lens, while in other embodiments a plurality of beamlets, including possibly all beamlets, will share an electro-optical lens.

Figure 3A:
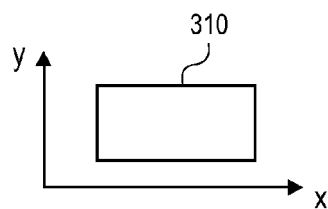
FIG. 3A illustrates an example of a rectangular shot.
Figure 3B:
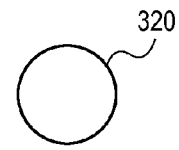
FIG. 3B illustrates an example of a circular character projection shot.
Figure 3C:
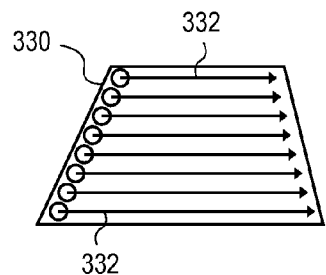
FIG. 3C illustrates an example of a trapezoidal shot.
Figure 3D:
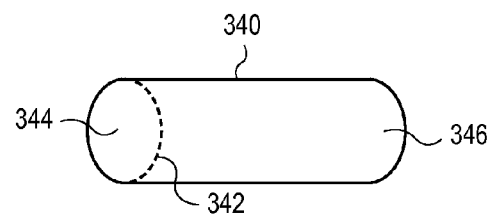
FIG. 3D illustrates an example of a dragged shot.

For purposes of this disclosure, a shot is the exposure of some surface area over a period of time. The area may be comprised of multiple discontinuous smaller areas. A shot may be comprised of a plurality of other shots which may or may not overlap, and which may or may not be exposed simultaneously. A shot may comprise a specified dose, or the dose may be unspecified. Shots may use a shaped beam, an unshaped beam, or a combination of shaped and unshaped beams. FIG. 3 illustrates some various types of shots. FIG. 3A illustrates an example of a rectangular shot 310. A VSB charged particle beam system can, for example, form rectangular shots in a variety of x and y dimensions. FIG. 3B illustrates an example of a character projection (CP) shot 320, which is circular in this example. FIG. 3C illustrates an example of a trapezoidal shot 330. In one embodiment, shot 330 may be a created using a raster-scanned charged particle beam, where the beam is scanned, for example, in the x-direction as illustrated with scan lines 332. FIG. 3D illustrates an example of a dragged shot 340, disclosed in U.S. Patent Application Publication 2011-0089345. Shot 340 is formed by exposing the surface with a curvilinear shaped beam 342 at an initial reference position 344, and then moving the shaped beam across the surface from position 344 to position 346. A dragged shot path may be, for example, linear, piecewise linear, or curvilinear.

Figure 3E:
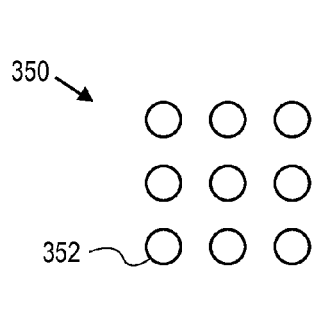
FIG. 3E illustrates an example of a shot which is an array of circular patterns.
Figure 3F:
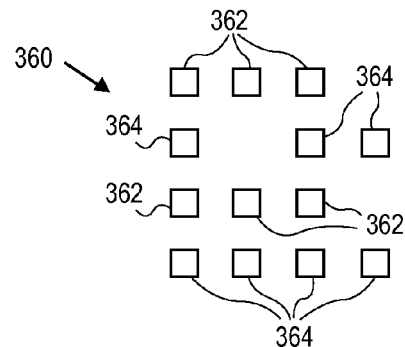
FIG. 3F illustrates an example of a shot which is a sparse array of rectangular patterns.

FIG. 3E illustrates an example of a shot 350 that is an array of circular patterns 352. Shot 350 may be formed in a variety of ways, including multiple shots of a single circular CP character, one or more shots of a CP character which is an array of circular apertures, and one or more multi-beam shots using circular apertures. FIG. 3F illustrates an example of a shot 360 that is a sparse array of rectangular patterns 362 and 364. Shot 360 may be formed in a variety of ways, including a plurality of VSB shots, a CP shot, and one or more multi-beam shots using rectangular apertures. In some embodiments of multi-beam, shot 360 may comprise a plurality of interleaved groups of other multi-beam shots. For example, patterns 362 may be shot simultaneously, then patterns 364 may be shot simultaneously at a time different from patterns 362.

Figure 4:
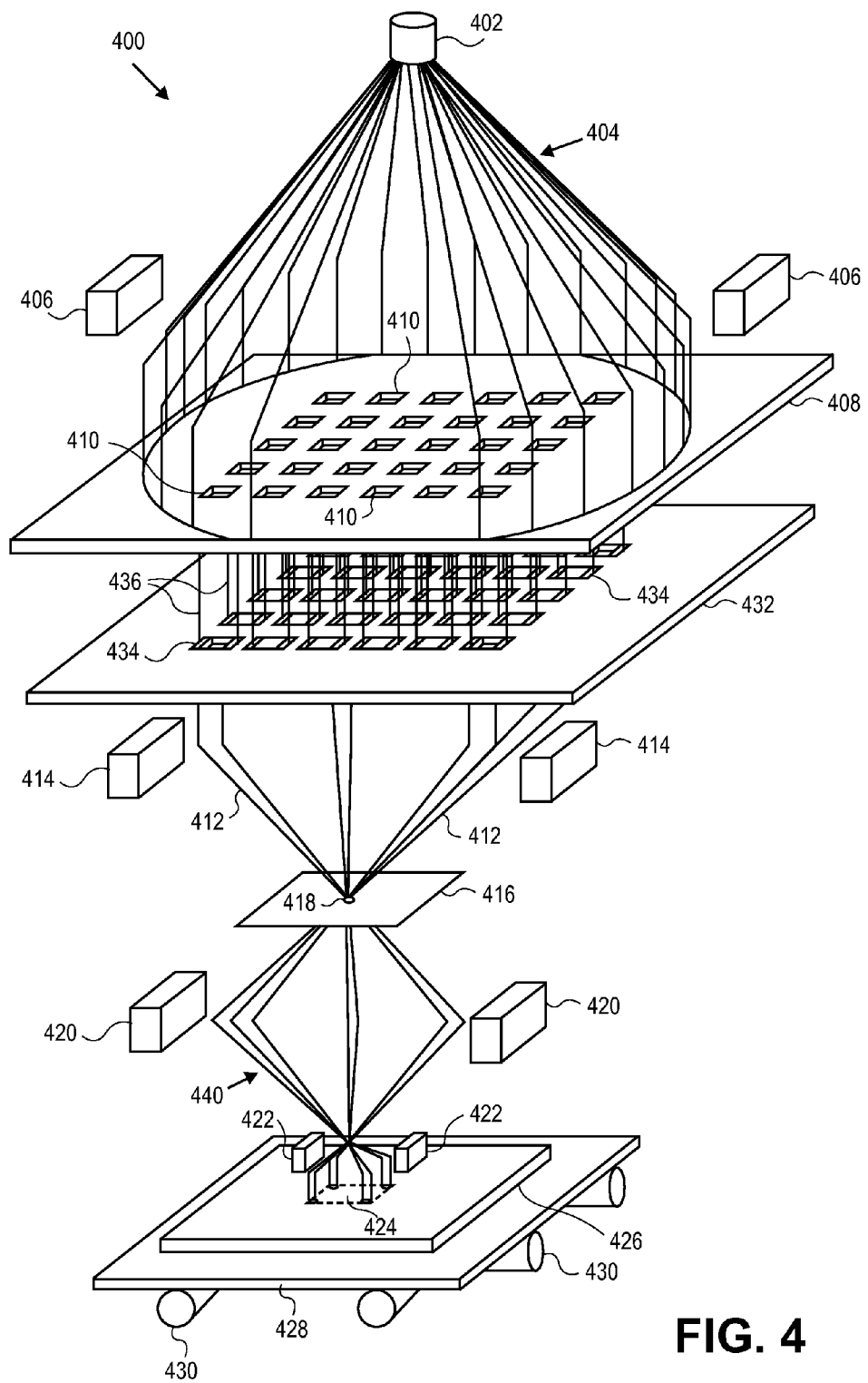
FIG. 4 illustrates an example of a multi-beam charged particle beam system.

FIG. 4 illustrates an embodiment of a charged particle beam exposure system 400. Charged particle beam system 400 is a multi-beam system, in which a plurality of individually-controllable shaped beams can simultaneously expose a surface. Multi-beam system 400 has an electron beam source 402 that creates an electron beam 404. The electron beam 404 is directed toward aperture plate 408 by condenser 406, which may include electrostatic and/or magnetic elements. Aperture plate 408 has a plurality of apertures 410 which are illuminated by electron beam 404, and through which electron beam 404 passes to form a plurality of shaped beamlets 436. In some embodiments, aperture plate 408 may have hundreds or thousands of apertures 410. Although FIG. 4 illustrates an embodiment with a single electron beam source 402, in other embodiments apertures 410 may be illuminated by electrons from a plurality of electron beam sources. Apertures 410 may be rectangular, or may be of a different shape, for example circular. The set of beamlets 436 then illuminates a blanking controller plate 432. The blanking controller plate 432 has a plurality of blanking controllers 434, each of which is aligned with a beamlet 436. Each blanking controller 434 can individually control its associated beamlet 436, so as to either allow the beamlet 436 to strike surface 424, or to prevent the beamlet 436 from striking the surface 424. The amount of time for which the beam strikes the surface controls the total energy or "dose" applied by that beamlet. Therefore, the dose of each beamlet may be independently controlled.

In FIG. 4 beamlets that are allowed to strike surface 424 are illustrated as beamlets 412. In one embodiment, the blanking controller 434 prevents its beamlet 436 from striking the surface 424 by deflecting beamlet 436 so that it is stopped by an aperture plate 416 which contains an aperture 418. In some embodiments, blanking plate 432 may be directly adjacent to aperture plate 408. In other embodiments, the relative locations of aperture plate 408 and blanking controller 432 may be reversed from the position illustrated in FIG. 4, so that beam 404 strikes the plurality of blanking controllers 434. A system of lenses comprising elements 414, 420, and 422 allows projection of the plurality of beamlets 412 onto surface 424 of substrate 426, typically at a reduced size compared to the plurality of apertures 410. The reduced-size beamlets form a beamlet group 440 which strikes the surface 424 to form a pattern that matches a pattern of a subset of apertures 410, the subset being those apertures 410 for which corresponding blanking controllers 434 allow beamlets 436 to strike surface 424. In FIG. 4, beamlet group 440 has four beamlets illustrated for forming a pattern on surface 424.

Substrate 426 is positioned on movable platform or stage 428, which can be repositioned using actuators 430. By moving stage 428, beam 440 can expose an area larger than the dimensions of the maximum size pattern formed by beamlet group 440, using a plurality of exposures or shots. In some embodiments, the stage 428 remains stationary during an exposure, and is then repositioned for a subsequent exposure. In other embodiments, stage 428 moves continuously and at a variable velocity. In yet other embodiments, stage 428 moves continuously but at a constant velocity, which can increase the accuracy of the stage positioning. For those embodiments in which stage 428 moves continuously, a set of deflectors (not shown) may be used to move the beam to match the direction and velocity of stage 428, allowing the beamlet group 440 to remain stationary with respect to surface 424 during an exposure. In still other embodiments of multi-beam systems, individual beamlets in a beamlet group may be deflected across surface 424 independently from other beamlets in the beamlet group.

Other types of multi-beam systems may create a plurality of unshaped beamlets 436, such as by using a plurality of charged particle beam sources to create an array of Gaussian beamlets.

Referring again for FIG. 1, the minimum size pattern that can be projected with reasonable accuracy onto a surface 12 is limited by a variety of short-range physical effects associated with the electron beam writer system 10 and with the surface 12, which normally comprises a resist coating on the substrate 34. These effects include forward scattering, Coulomb effect, and resist diffusion. Beam blur, also called $\beta_f$, is a term used to include all of these short-range effects. The most modern electron beam writer systems can achieve an effective beam blur radius or $\beta_f$ in the range of 20 nm to 30 nm. Forward scattering may constitute one quarter to one half of the total beam blur. Modern electron beam writer systems contain numerous mechanisms to reduce each of the constituent pieces of beam blur to a minimum. Since some components of beam blur are a function of the calibration level of a particle beam writer, the $\beta_f$ of two particle beam writers of the same design may differ. The diffusion characteristics of resists may also vary. Variation of $\beta_f$ based on shot size or shot dose can be simulated and systemically accounted for. But there are other effects that cannot or are not accounted for, and they appear as random variation. Note that in a multi-beam exposure system, the variation of $\beta_f$ which can be accounted for includes variation based on the number of beamlets in a given multi-beam shot, and on the dosage of each of the beamlets.

The shot dosage of a charged particle beam writer such as an electron beam writer system is a function of the intensity of the beam source 14 and the exposure time for each shot. Typically the beam intensity remains fixed, and the exposure time is varied to obtain variable shot dosages. Different areas in a shot may have different exposure times, such as in a multi-beam shot. The exposure time may be varied to compensate for various long-range effects such as backscatter, fogging, and loading effects in a process called proximity effect correction (PEC). Electron beam writer systems usually allow setting an overall dosage, called a base dosage, which affects all shots in an exposure pass. Some electron beam writer systems perform dosage compensation calculations within the electron beam writer system itself, and do not allow the dosage of each shot to be assigned individually as part of the input shot list, the input shots therefore having unassigned shot dosages. In such electron beam writer systems all shots have the base dosage, before PEC. Other electron beam writer systems do allow dosage assignment on a shot-by-shot basis. In electron beam writer systems that allow shot-by-shot dosage assignment, the number of available dosage levels may be 64 to 4096 or more, or there may be a relatively few available dosage levels, such as 3 to 8 levels.

Conventionally, shots are designed so as to completely cover an input pattern with rectangular shots, while avoiding shot overlap wherever possible within an exposure pass. Also, all shots are designed to have a normal dosage, which is a dosage at which a relatively large rectangular shot, in the absence of long-range effects, will produce a pattern on the surface which is the same size as is the shot size. Some electron beam writer systems enforce this methodology by not allowing shots to overlap within an exposure pass.

Figure 5A:
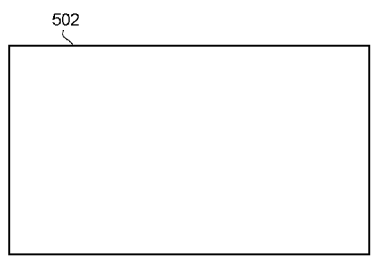
FIG. 5A illustrates an example of a rectangular pattern which is desired to be formed on a surface.
Figure 5B:
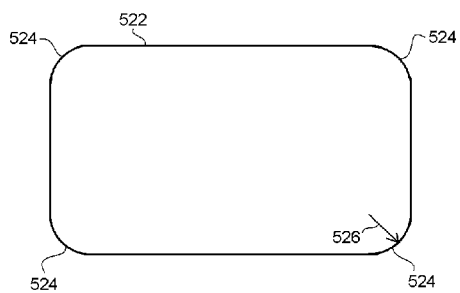
FIG. 5B illustrates an example of corner rounding when forming the pattern of FIG. 5A on a surface.

Conventionally-fractured Manhattan shapes having edge lengths of 100 nm or greater are relatively immune to $\beta_f$ variation. This is because Manhattan edges of desired mask shapes drawn with edges of VSB shots are insensitive to variation in $\beta_f$. For any designed Manhattan shape, however, the 90 degree corners in the designed shape will not be formed as 90 degree corners on a photomask. Instead, the corners will be rounded to a degree determined principally by the value of $\beta_f$. The corner-rounded regions are sensitive to $\beta_f$ even in conventionally-fractured shapes. FIG. 5A illustrates an example of a rectangular shape 502 that may be desired to be formed on a reticle. FIG. 5B illustrates an example of a shape 522 that may be formed on a reticle from shape 502 using a conventional VSB shot. The dimensions of shape 522 are the same as shape 502, except for the corner regions 524. The corner regions 524 of shape 522 are rounded due to $\beta_f$, compared to the sharp corners of shape 502. The radius 526 of the corners 524 depends on the value of $\beta_f$: a larger $\beta_f$ will produce a larger radius of rounding, and a smaller $\beta_f$ will produce a smaller radius of rounding.

Figure 6A:
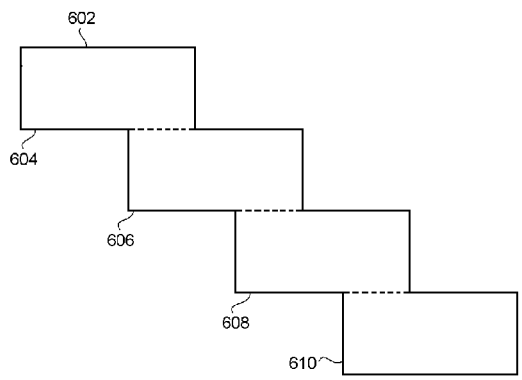
FIG. 6A illustrates an another example of a pattern which is desired to be formed on a surface.
Figure 6B:
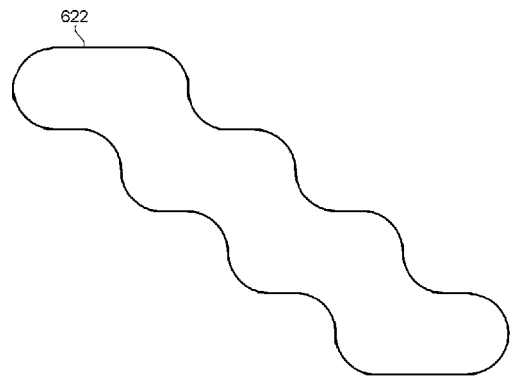
FIG. 6B illustrates an example of corner rounding when forming the pattern of FIG. 6A on a surface.

With the continual advancement in semiconductor technology requiring creation of photomasks with sub-100 nm features, the consequent requirement for higher precision means that conventional fracturing, even for Manhattan shapes, becomes increasingly sensitive to dose margin and other manufacturing variation. Furthermore, when the shapes desired on the masks include small (sub-80 nm) Manhattan jogs, diagonal features, or curvilinear features, conventionally-fractured shapes have increased sensitivity to dose margin, $\beta_f$ and other manufacturing variations. FIG. 6A illustrates an example of a pattern 602 that may be desired to be formed on a reticle. Pattern 602 may be conventionally exposed using four VSB shots, including shot 604, shot 606, shot 608, and shot 610. In pattern 602 boundaries between the shots are illustrated using dashed lines. FIG. 6B illustrates a pattern 622 that may be formed on a reticle from shape 602 using the set of conventional VSB shots 604, 606, 608 and 610. As can be seen, corners on pattern 622 are rounded due to $\beta_f$ with a similar corner radius as is illustrated in shape 522. The pattern 622, however, is relatively more sensitive to $\beta_f$ variation than is the shape 522. In other words, the shape of pattern 622 on the reticle is more heavily affected by variation in $\beta_f$ than is the shape of pattern 522. One factor causing the relatively greater sensitivity of pattern 622 to $\beta_f$ variation compared to shape 522 is the relatively smaller size of the shots used in pattern 622, compared to the shot used in pattern 522.

As indicated above, the edges of Manhattan shapes of 100 nm or greater edge lengths are relatively immune to $\beta_f$ variation when conventional fracturing using non-overlapping VSB shots is used. By contrast, the added flexibility of using overlapping shots and/or shots with dose modulation both increases the opportunity to improve pattern tolerance to manufacturing variation and increases the need to choose, among available solutions, the solution that optimizes for manufacturing variation.

Figure 7A:
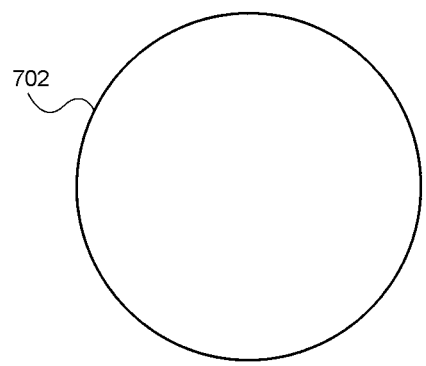
FIG. 7A illustrates an example of a circular pattern which is desired to be formed on a surface.
Figure 7B:
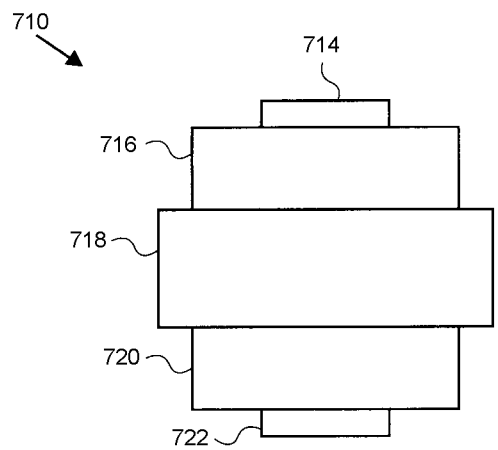
FIG. 7B illustrates an example of a set of conventional non-overlapping VSB shots that can form the circular pattern of FIG. 7A.
Figure 7C:
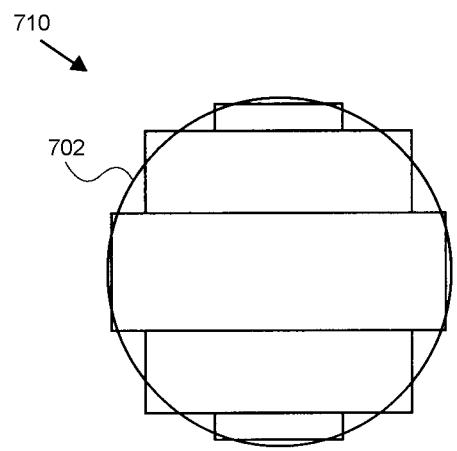
FIG. 7C illustrates the set of shots of FIG. 7B, overlaid with the circular pattern of FIG. 7A.

FIG. 7A illustrates an example of a circular pattern 702 that is desired to be formed on a resist-coated surface, the pattern having a diameter of 350 nm. Circular patterns may be used, for example, to form contacts or vias between layers in a semiconductor manufacturing process. FIG. 7B illustrates a set of conventional non-overlapping VSB shots 710 which may be used to form the pattern 702. The set of shots 710 consists of five shots: shot 714, shot 716, shot 718, shot 720 and shot 722. FIG. 7C illustrates the set of shots 710 of FIG. 7B overlaid with the circular pattern 702 of FIG. 7A. Conventionally, the shots in set of shots 710 will all have the same dosage, before long-range correction is applied.

Figure 8A:
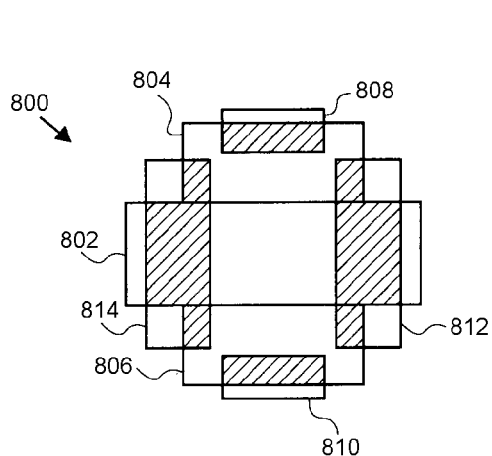
FIG. 8A illustrates an example of a set of overlapping VSB shots which can form the circular pattern of FIG. 7A.
Figure 8B:
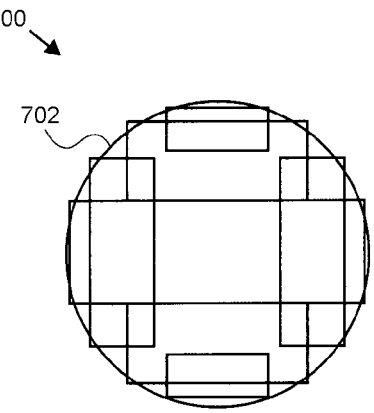
FIG. 8B illustrates the set of shots of FIG. 8A, overlaid with the circular pattern of FIG. 7A.

FIG. 8A illustrates a set of overlapping VSB shots 800 that may also be used to form circular pattern 702. Set of shots 800 consists of seven shots: shot 802, shot 804, shot 806, shot 808, shot 810, shot 812 and shot 814. For clarity, the areas where shots overlap are shaded with cross-hatching. The dosage of the shots in set of shots 800 may vary from shot to shot, before long-range correction. FIG. 8B illustrates the set of shots 800 overlaid with the desired circular pattern 702. Use of model-based fracturing techniques with overlapping shots such as set of shots 800 may allow formation of patterns of a given accuracy with fewer shots, compared to conventional non-overlapping shots, particularly with curvilinear patterns. Similarly, when pattern accuracy is the primary objective, model-based fracturing may be used to form higher quality patterns for a given number of shots, compared to conventional non-overlapping shots, particularly with curvilinear patterns such as circular or nearly-circular patterns.

Figure 9:
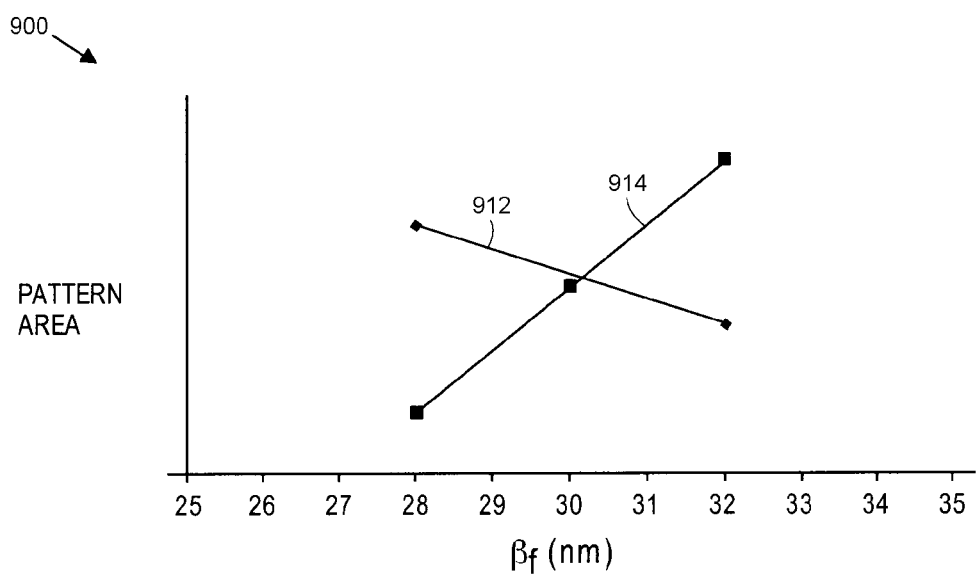
FIG. 9 illustrates an example of a graph relationship between pattern area and $\beta_f$ for two set of shots.

The pattern that will be produced on a surface from a set of charged particle beam shots may be determined through simulation techniques. A set of shots may be simulated for a plurality of values of $\beta_f$ to determine the sensitivity of the pattern to changes in $\beta_f$. FIG. 9 illustrates an example of a graph 900 of the pattern area produced on the surface for various values of $\beta_f$, for set of shots 710 and for set of shots 800. Curve 912 illustrates a calculated pattern area for set of shots 710. Curve 914 illustrates a calculated pattern area for set of shots 800. As can be seen, a variation of $\beta_f$ between 28 nm and 32 nm produces a variation in pattern area for both curve 912 and curve 914. The negative slope of curve 912 indicates that set of shots 710 produces a reduced pattern area as $\beta_f$ increases. By contrast, the positive slope of curve 914 indicates that set of shots 800 produces an increased pattern area as $\beta_f$ increases. The difference between the sign of the slope of curve 912, which is from a set of shots with no overlap, and the sign of the slope of curve 914, which is from a set of shots with overlap which produces varying dosage in different parts of the pattern, suggests that it may be possible to find a dosage distribution for which the pattern area is insensitive to uniform variation in $\beta_f$ for the shots forming the pattern. One embodiment of the current invention comprises adjusting the amount of shot overlap so as to reduce the absolute value of the slope of the pattern area curve with respect to $\beta_f$. For some pattern configurations, a set of shots may be generated which produce a nearly zero slope curve, that is where, over some range of values of $\beta_f$, a change in $\beta_f$ produces no change in pattern area. In other embodiments of the invention, pattern parameters other than pattern area may be adjusted to be insensitive to variations of $\beta_f$. In one embodiment, shot overlap may be adjusted to produce a dosage pattern which produces a surface pattern in which a critical dimension is insensitive to changes in $\beta_f$ over some pre-determined range.

The most significant source of variation of $\beta_f$ across shots is the Coulomb effect, an effect of negatively-charged electrons repelling against each other as the beam crosses over. Coulomb effect is an open area dependent factor, meaning that Coulomb effect depends on the area of the charged particle beam illuminating the surface for a given shot. A larger area increases Coulomb effect, as more electrons in the beam create greater repelling forces. The above described method of optimizing is more effective when the underlying E-beam simulation models the shot size dependency of $\beta_f$.

Figure 10A:
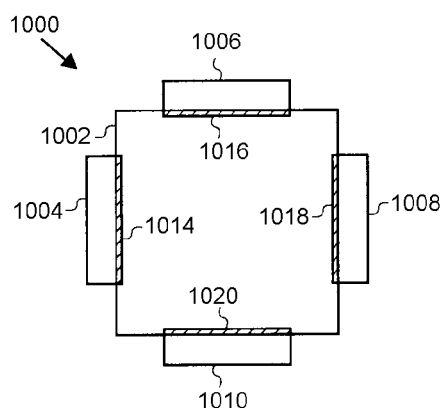
FIG. 10A illustrates an exemplary set of overlapping VSB shots which can form the circular pattern of FIG. 7A according to the current invention.
Figure 10B:
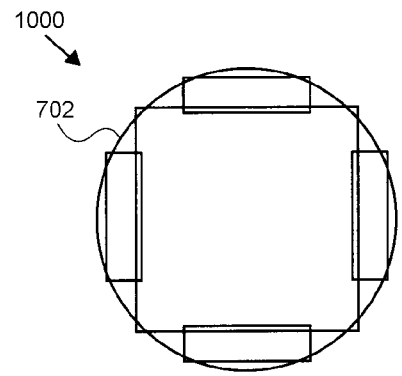
FIG. 10B illustrates the set of shots of FIG. 10A, overlaid with the circular pattern of FIG. 7A.
Figure 11:
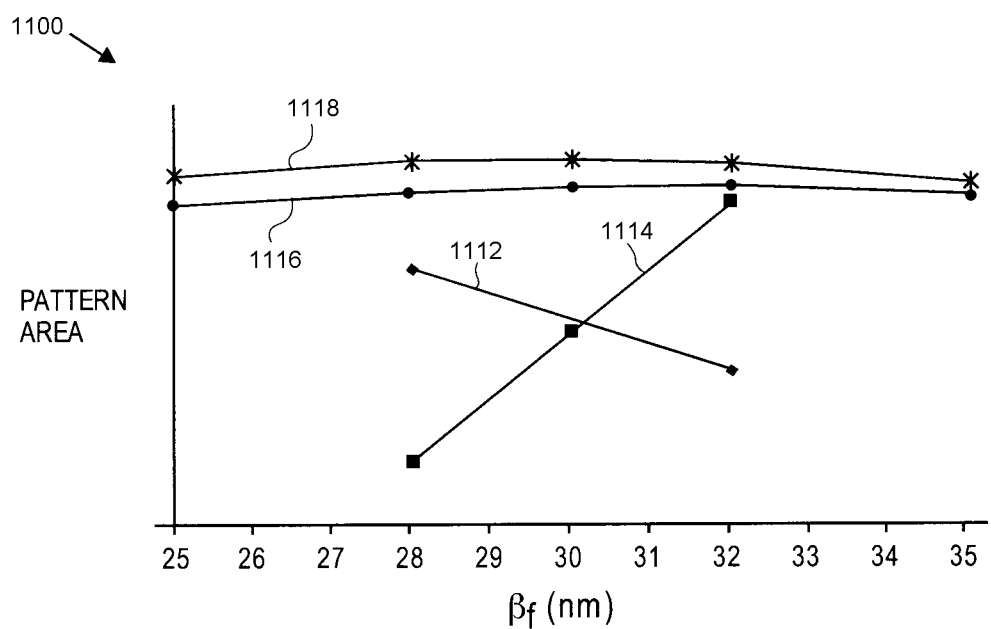
FIG. 11 illustrates an example of a graph relationship between pattern area and $\beta_f$ for four set of shots.

FIG. 10A illustrates an exemplary set of shots 1000 which can form pattern 702 on a surface, according one embodiment of the current invention. Set of shots 1000 consists of five shots: shot 1002, shot 1004, shot 1006, shot 1008 and shot 1010. In FIG. 10A the areas of overlap in set of shots 1000 are shaded using cross-hatching. Areas of overlap consist of area 1014, area 1016, area 1018 and area 1020. The amount of overlap in set of shots 1000 is less than that in set of shots 800, and the area of relatively high pattern dosage created by set of shots 1000 is therefore smaller than the area of relatively high pattern dosage created by set of shots 800. FIG. 10B illustrates set of shots 1000 overlaid with circular pattern 702. FIG. 11 illustrates an example of a graph 1100 of pattern area with respect to $\beta_f$, similar to graph 900. In graph 1100, curve 1112 corresponds to graph 900 curve 912, which is the variation of pattern area for set of shots 710. Curve 1114 corresponds to graph 900 curve 914, which is the variation of pattern area for set of shots 800. Curve 1116 illustrates an example of the calculated pattern area with respect to variation of $\beta_f$ for set of shots 1000. As can be seen, the absolute value of the slope of curve 1116 is smaller than either of the slopes of curve 1112 or of curve 1114. This indicates that variations of $\beta_f$ will have little effect on the area of the pattern produced on a surface from set of shots 1000, relative to set of shots 710 or to set of shots 800. This insensitivity to $\beta_f$ is desirable, indicating that a more accurate pattern can be formed on the surface, in the face of manufacturing process variations that may affect $\beta_f$. In one embodiment, the surface to which the circular pattern is being transferred is a reticle which will be used in an optical lithographic process to transfer the pattern to a substrate such as a silicon wafer. A more accurate pattern on the reticle may produce a more accurate pattern on the wafer, leading, for example, to a higher wafer manufacturing yield.

In some embodiments of the invention, the adjustment of shot overlap, for example to minimize $\beta_f$ sensitivity, may be part of a two step process. In the first step, an initial set of shots is determined that can form a desired pattern on the surface. Shots in this initial set of shots may overlap. This first step may comprise use of charged particle beam simulation to determine the pattern that will be formed on the surface. In the second step, shot overlap is adjusted to reduce sensitivity to $\beta_f$ variation. It is important that the process of adjusting shot overlap to reduce $\beta_f$ sensitivity not significantly change the pattern shape on the surface, the dose margin, or other criteria that affect the quality of the mask. Charged particle beam simulation may also be used in the second step, to determine the pattern that will be produced on the surface for various values of $\beta_f$. In the example of FIG. 10A, the second step of adjusting shot overlap may comprise one or more sub-steps. If charged particle beam simulation of the initial set of shots determines that additional shot overlap is required to reduce $\beta_f$ sensitivity, then two exemplary sub-steps that may be used to accomplish this are as follows:

Move the inside edges of shots 1004, 1006, 1008 and 1010 to increase overlap with shot 1002. Edge 1014 of shot 1004 is moved in the positive "x" direction, edge 1016 of shot 1006 is moved in the negative "y" direction, edge 1018 of shot 1008 is moved in the negative "x" direction, and edge 1020 of shot 1010 is moved in the positive "y" direction.

Move the outside edges of shots 1004, 1006, 1008 and 1010 in the same direction that the inside edges of these shots were moved in the previous sub-step. Movement of the outside edges is done to prevent to prevent expansion of the pattern shape on the surface due to the additional dosage provided by moving the inside edges in the previous sub-step. The outside edges will generally need to move less than the inside edges were moved.

The two sub-steps may be combined in practice. This example illustrates one technique for adjusting shot overlap while maintaining the integrity of the pattern that will be formed on the surface. In other embodiments of this invention, determination of shots to produce a desired surface pattern and adjustment of shot overlap to reduce $\beta_f$ sensitivity may be combined into a single step or process.

Figure 10C:
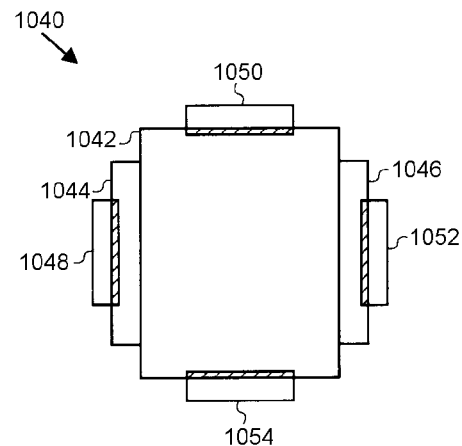
FIG. 10C illustrates another exemplary set of overlapping VSB shots which can form the circular pattern of FIG. 7A according to the current invention.
Figure 10D:
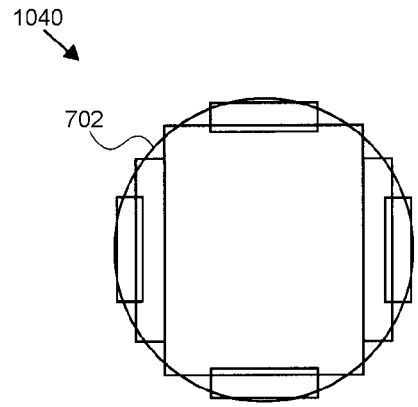
FIG. 10D illustrates the set of shots of FIG. 10C, overlaid with the circular pattern of FIG. 7A.

FIG. 10C illustrates another exemplary set of overlapping shots 1040 that can form the circular pattern 702 on a surface. Set of shots 1040 consists of seven shots: shot 1042, shot 1044, shot 1046, shot 1048, shot 1050, shot 1052, and shot 1054. Although each shot in set of shots 1040 overlaps at least one other shot, in other embodiments, some shots in a set of shots may not overlap other shots. In FIG. 10C, the areas of shot overlap are illustrated as cross-hatched. The seven shot set of shots 1040 may produce a pattern on the surface which more closely approximates circular pattern 702 than would a pattern produced by the five shot set of shots 1000. In FIG. 11 graph 1100, curve 1118 illustrates an example of the area of the pattern produced by set of shots 1040 with varying values of $\beta_f$. As can be seen, the absolute value of the slope of curve 1118, like the absolute value of the slope of curve 1116, is less than either curve 1112 or curve 1114.

The near-zero slopes of graph 1100 curve 1116 and curve 1118 can be achieved by adjusting the amount of overlap in a set of shots producing a pattern such as pattern 702. An increasing area of overlap may increase the slope of the curve, and a decreasing amount of overlap may decrease the slope of the curve. Also, a change in shot overlap near the perimeter of a pattern may affect the $\beta_f$ sensitivity of the pattern more than a similar change in shot overlap further from the perimeter of the pattern. In some embodiments of this invention, rule-based techniques may be used to determine the proper shot configurations for reducing $\beta_f$ sensitivity.

Shot overlap may also be used to reduce $\beta_f$ dependency when a plurality of overlapping complex character projection shots are used to form a pattern, and when a combination of complex character projection shots and VSB shots are used to form a pattern.

In another embodiment of this disclosure, one or more multi-beam shots may be used to form pattern 702, for example. Dosage of individual beamlets in the multi-beam shot(s) may be modulated to, for example, provide a higher dosage to areas near the perimeter of the pattern 702 than the dosage that is delivered to other parts of the pattern. The size of these areas of higher dosage may be enlarged or contracted, corresponding to an increase or decrease in shot overlap as in the previous embodiment. The effect of the higher dosage on the pattern may, for example, be simulated using charged particle beam simulation for various values of $\beta_f$. The size of the areas of higher dosage can be varied, and the shape modified, to reduce the $\beta_f$ sensitivity.

More generally, any type of charged particle beam lithography may be used, as long as higher dosage can be delivered to areas of the pattern near the pattern perimeter than to other areas of the pattern. The size, shape and specific location of these areas of higher dosage are determined to reduce $\beta_f$ sensitivity. The size and shape of these areas may be determined iteratively, using optimization techniques, or by using non-iterative techniques. In some embodiments, rule-based techniques may be used to determine the size, shape, and/or the location of the areas of higher dosage.

The calculations described or referred to in this invention may be accomplished in various ways. Generally, calculations may be accomplished by in-process, pre-process or post-process methods. In-process calculation involves performing a calculation when its results are needed. Pre-process calculation involves pre-calculating and then storing results for later retrieval during a subsequent processing step, and may improve processing performance, particularly for calculations that may be repeated many times. Calculations may also be deferred from a processing step and then done in a later post-processing step. An example of pre-process calculation is pre-calculating the change in sensitivity of patterns of various types to changes in $\beta_f$ for various amounts of shot overlap change. Another example of pre-process calculation is a shot group, which is a pre-calculation of dosage pattern information for one or more shots associated with a given input pattern or set of input pattern characteristics. The shot group and the associated input pattern may be saved in a library of pre-calculated shot groups, so that the set of shots comprising the shot group can be quickly generated for additional instances of the input pattern, without pattern re-calculation. In some embodiments, the pre-calculation may comprise simulation of the dosage pattern that the shot group will produce on a resist-coated surface. In other embodiments, the shot group may be determined without simulation, such as by using correct-by-construction techniques. In some embodiments, the pre-calculated shot groups may be stored in the shot group library in the form of a list of shots. In other embodiments, the pre-calculated shot groups may be stored in the form of computer code that can generate shots for a specific type or types of input patterns. In yet other embodiments, a plurality of pre-calculated shot groups may be stored in the form of a table, where entries in the table correspond to various input patterns or input pattern characteristics such as pattern width, and where each table entry provides either a list of shots in the shot group, or information for how to generate the appropriate set of shots. Additionally, different shot groups may be stored in different forms in the shot group library. In some embodiments, the dosage pattern which a given shot group can produce may also be stored in the shot group library. In one embodiment, the dosage pattern may be stored as a two-dimensional (X and Y) dosage map called a glyph.

Figure 12:
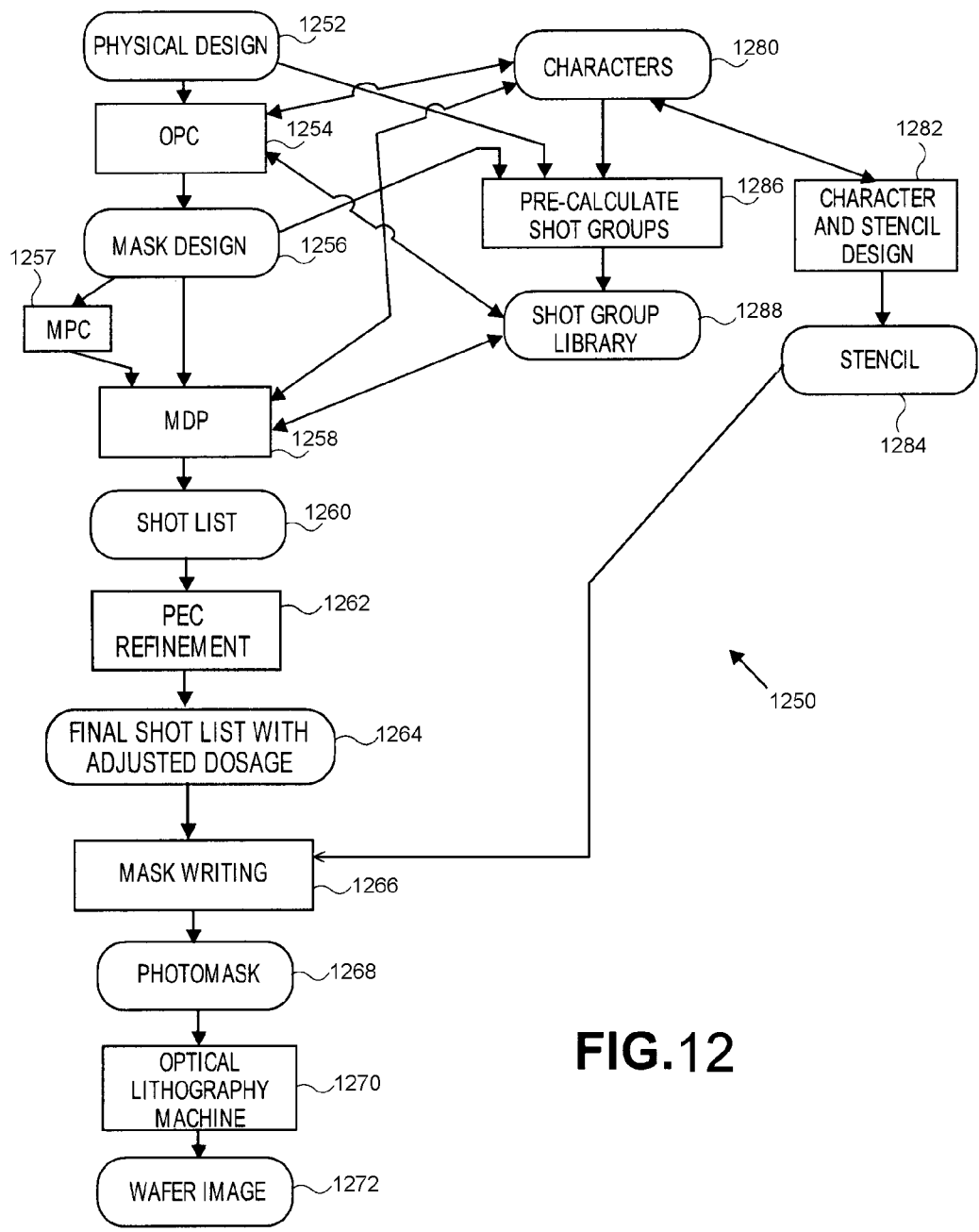
FIG. 12 illustrates an embodiment of a conceptual flow diagram of how to prepare a surface in fabricating a substrate such as an integrated circuit on a silicon wafer.

FIG. 12 is a conceptual flow diagram 1250 of how to prepare a reticle for use in fabricating a surface such as an integrated circuit on a silicon wafer. In a first step 1252, a physical design, such as a physical design of an integrated circuit, is designed. This can include determining the logic gates, transistors, metal layers, and other items that are required to be found in a physical design such as that in an integrated circuit. The physical design may be rectilinear, partially curvilinear, or completely curvilinear. Next, in a step 1254, optical proximity correction (OPC) is determined. In an embodiment of this disclosure, this can include taking as input a library of pre-calculated shot groups from a shot group library 1288. This can also alternatively, or in addition, include taking as input a library of pre-designed characters 1280 including complex characters that are to be available on a stencil 1284 in a step 1266. In an embodiment of this disclosure, an OPC step 1254 may also include simultaneous optimization of shot count or write times, and may also include a fracturing operation, a shot placement operation, a dose assignment operation, or may also include a shot sequence optimization operation, or other mask data preparation operations, with some or all of these operations being simultaneous or combined in a single step. The OPC step may create partially or completely curvilinear patterns. The output of the OPC step 1254 is a mask design 1256.

Mask process correction (MPC) 1257 may optionally be performed on the mask design 1256. MPC modifies the pattern to be written to the reticle so as to compensate for non-linear effects, such as effects associated with patterns smaller than about 100 nm in conventional optical lithographic masks. MPC may also be used to compensate for non-linear effects affecting EUV masks. If MPC 1257 is performed, its output becomes the input for mask data preparation (MDP) step 1258.

In a step 1258, a mask data preparation (MDP) operation which may include a fracturing operation, a shot placement operation, a dose assignment operation, or a shot sequence optimization may take place. MDP may use as input the mask design 1256 or the results of MPC 1257. In some embodiments of the present invention, MPC may be performed as part of a fracturing or other MDP operation. Other corrections may also be performed as part of fracturing or other MDP operation, the possible corrections including: forward scattering, resist diffusion, coulomb effect, etching, backward scattering, fogging, loading, resist charging, and EUV midrange scattering. The result of MDP step 1258 is a shot list 1260. Either the OPC step 1254 or of the MDP step 1258, or a separate program 1286 can include pre-calculating one or more shot groups that may be used for a given input pattern, and storing this information in a shot group library 1288. Combining OPC and any or all of the various operations of mask data preparation in one step is contemplated in this disclosure. Mask data preparation step 1258, which may include a fracturing operation, may also comprise a pattern matching operation to match pre-calculated shot groups to create a mask that matches closely to the mask design. Mask data preparation step 1258 may also comprise increasing dosage in select areas of the pattern, such as by varying the overlap of shots or by using dose-modulated shots or multi-beam shot beamlets, so that the resulting pattern or portions of the pattern on photomask 1268 has reduced sensitivity to variations in $\beta_f$. Mask data preparation step 1258 may also comprise increasing the dose margin of the pattern on the photomask 1268. Mask data preparation may also comprise inputting patterns to be formed on a surface with the patterns being slightly different, selecting a set of characters to be used to form the number of patterns, the set of characters fitting on a stencil mask, the set of characters possibly including both complex and VSB characters, and the set of characters based on varying character dose or varying character position or varying the beam blur radius or applying partial exposure of a character within the set of characters or dragging a character to reduce the shot count or total write time. A set of slightly different patterns on the surface may be designed to produce substantially the same pattern on a substrate. Also, the set of characters may be selected from a predetermined set of characters. In one embodiment of this disclosure, a set of characters available on a stencil in a step 1280 that may be selected quickly during the mask writing step 1262 may be prepared for a specific mask design. In that embodiment, once the mask data preparation step 1258 is completed, a stencil is prepared in a step 1284. In another embodiment of this disclosure, a stencil is prepared in the step 1284 prior to or simultaneous with the MDP step 1258 and may be independent of the particular mask design. In this embodiment, the characters available in the step 1280 and the stencil layout are designed in step 1282 to output generically for many potential mask designs 1256 to incorporate patterns that are likely to be output by a particular OPC program 1254 or a particular MDP program 1258 or particular types of designs that characterizes the physical design 1252 such as memories, flash memories, system on chip designs, or particular process technology being designed to in physical design 1252, or a particular cell library used in physical design 1252, or any other common characteristics that may form different sets of slightly different patterns in mask design 1256. The stencil can include a set of characters, such as a limited number of characters that was determined in the step 1258.

In a proximity effect correction (PEC) refinement step 1262, dosages of the shots in shot list 1260 may be adjusted to account for one or more long-range effects including backscatter, fogging, and loading, creating a final shot list with adjusted dosages 1264. The final shot list with adjusted dosages 1264 is used to generate a surface in a mask writing step 1266, which uses a charged particle beam writer such as an electron beam writer system. Mask writing step 1266 may use stencil 1284, which may contain both VSB apertures and a plurality of complex characters. The electron beam writer system projects a beam of electrons onto a surface to form patterns on a surface such as a reticle, which is then processed to become a photomask 1268. The completed photomask 1268 may then be used in an optical lithography machine, which is shown in a step 1270. Finally, in a step 1272, a substrate such as a silicon wafer is produced. As has been previously described, in step 1280 characters may be provided to the OPC step 1254 or the MDP step 1258. The step 1280 also provides characters to a character and stencil design step 1282 or a shot group pre-calculation step 1286. The character and stencil design step 1282 provides input to the stencil step 1284 and to the characters step 1280. The shot group generation step 1286 provides information to the shot group library 1288. Also, the shot group pre-calculation step 1286 may use as input the physical design 1252 or the mask design 1256, and may pre-calculate one or more shot groups, which are stored in a shot group library 1288.

Figure 13:
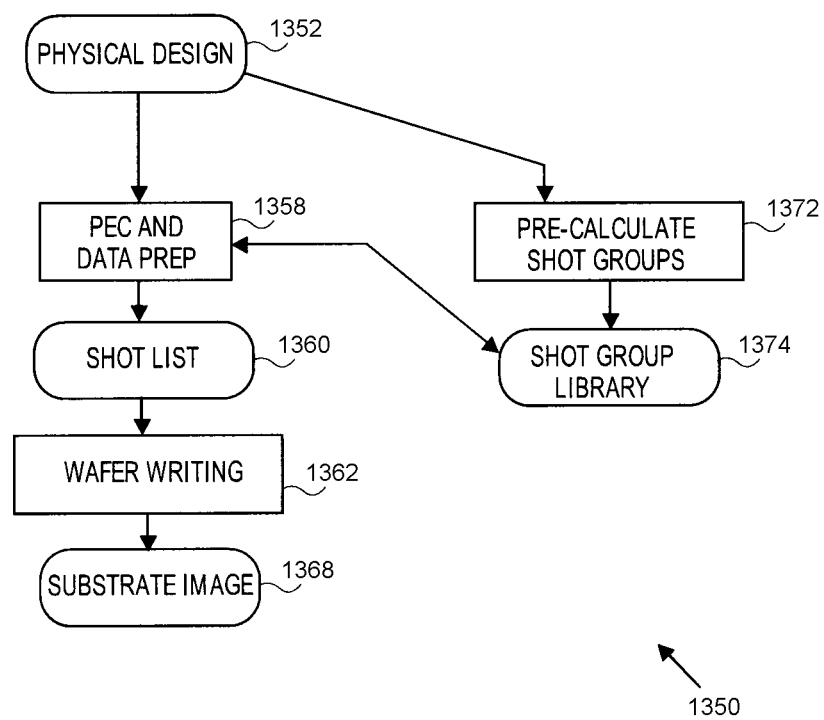
FIG. 13 illustrates an embodiment of a conceptual flow diagram of how to prepare a surface in fabricating a substrate such as an integrated circuit on a silicon wafer.

Referring now to FIG. 13, another conceptual flow diagram 1350 of how to prepare a surface which is directly written on a substrate such as a silicon wafer is shown. In a first step 1352, a physical design, such as a physical design of an integrated circuit is determined. This may be an ideal pattern that the designer wants transferred onto a substrate. The physical design may be rectilinear, partially curvilinear, or completely curvilinear. Next, in a step 1358, proximity effect correction (PEC), and other data preparation (DP) steps such as fracturing are performed to prepare input data to a substrate writing device. The step 1358 may comprise increasing dosage in select areas of the pattern, such as by varying the overlap of shots or by using dose-modulated shots or multi-beam shot beamlets, so that the resulting pattern in substrate image 1368 has reduced sensitivity to variations in $\beta_f$. The step 1358 may also comprise inputting possible glyphs or parameterized glyphs from step 1374, the glyphs being based on possibly overlapping VSB shots, and the glyphs being determined using a calculation of varying a shot dose or varying a shot position in glyph generation step 1372. The step 1358 may also comprise pattern matching to match glyphs to create a wafer image that matches closely to the physical design created in the step 1352. Iterations, potentially including only one iteration where a correct-by-construction "deterministic" calculation is performed, of pattern matching, dose assignment, and equivalence checking may also be performed. The result of step 1358 is a shot list 1360, which is then used to prepare a wafer in a wafer writing step 1362. In one embodiment, wafer writing 1362 may be accomplished using an electron beam writer system. The electron beam writer system projects a beam of electrons onto a surface to form patterns on substrate 1368 such as a silicon wafer. A shot group pre-calculation step 1372 provides information to the shot group library 1374. Also, the shot group pre-calculation step 1372 may use as input the physical design 1352, and may pre-calculate one or more shot groups, which are stored in a shot group library 1374. The step 1362 may include repeated application as required for each layer of processing, potentially with some processed using the methods described in association with FIG. 12, and others processed using the methods outlined above with respect to FIG. 13, or others produced using any other wafer writing method to produce integrated circuits on the silicon wafer.

The fracturing, mask data preparation, proximity effect correction and shot group creation flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the special-purpose hardware device may be a graphics processing unit (GPU). In another embodiment, the optimization and simulation processes described in this disclosure may include iterative processes of revising and recalculating possible solutions, so as to minimize either the total number of shots, or the total charged particle beam writing time, or some other parameter. In yet another embodiment, an initial set of shots may be determined in a correct-by-construction method, so that no shot modifications are required.

Figure 14:
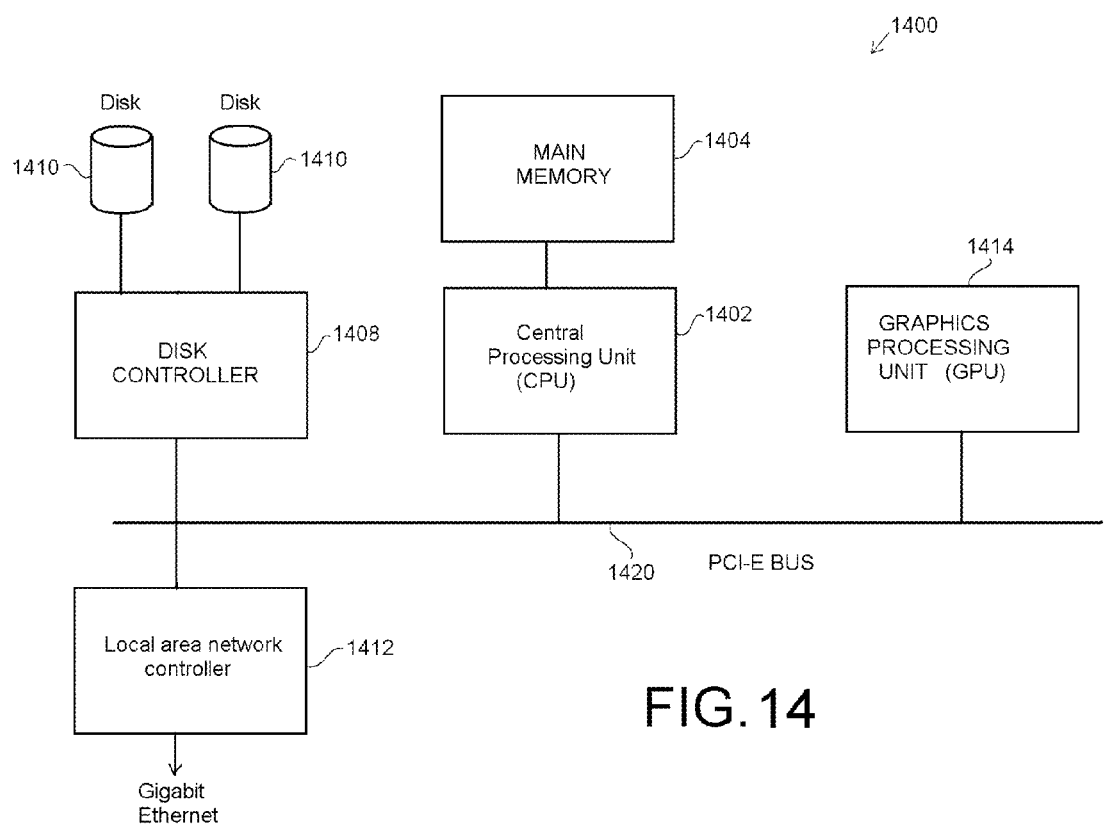
FIG. 14 illustrates an exemplary computing hardware device used in embodiments of the methods.

FIG. 14 illustrates an example of a computing hardware device 1400 that may be used to perform the calculations described in this disclosure. Computing hardware device 1400 comprises a central processing unit (CPU) 1402, with attached main memory 1404. The CPU may comprise, for example, eight processing cores, thereby enhancing performance of any parts of the computer software that are multi-threaded. The size of main memory 1404 may be, for example, 64 G-bytes. The CPU 1402 is connected to a Peripheral Component Interconnect Express (PCIe) bus 1420. A graphics processing unit (GPU) 1414 is also connected to the PCIe bus. In computing hardware device 1400 the GPU 1414 may or may not be connected to a graphics output device such as a video monitor. If not connected to a graphics output device, GPU 1414 may be used purely as a high-speed parallel computation engine. The computing software may obtain significantly-higher performance by using the GPU for a portion of the calculations, compared to using CPU 1402 for all the calculations. The CPU 1402 communicates with the GPU 1414 via PCIe bus 1420. In other embodiments (not illustrated) GPU 1414 may be integrated with CPU 1402, rather than being connected to PCIe bus 1420. Disk controller 1408 may also be attached to the PCIe bus, with, for example, two disks 1410 connected to disk controller 1408. Finally, a local area network (LAN) controller 1412 may also be attached to the PCIe bus, and provides Gigabit Ethernet (GbE) connectivity to other computers. In some embodiments, the computer software and/or the design data are stored on disks 1410. In other embodiments, either the computer programs or the design data or both the computer programs and the design data may be accessed from other computers or file serving hardware via the GbE Ethernet.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, mask data preparation, proximity effect correction and optical proximity correction may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for use with a charged particle beam lithographic process comprising a beam blur ($\beta_f$), the method comprising:
   determining, during a fracturing or a mask data preparation or a mask process correction, a set of charged particle beam shots that will form a desired pattern on a surface by producing a charged particle dosage on the surface,
   wherein the determining comprises calculating a pattern formed on the surface, and wherein the calculating includes variation of $\beta_f$ due to variation in Coulomb effect.

2. The method of claim 1 wherein the Coulomb effect for a shot in the set of charged particle beam shots depends on an area of the shot.

3. The method of claim 1 wherein shots in the set of charged particle beam shots comprise multi-beam shots, wherein each multi-beam shot comprises a number of beamlets, and wherein the Coulomb effect depends on the number of beamlets and the dosage of each of the beamlets.

4. The method of claim 1 wherein the determining comprises revising the set of charged particle beam shots such that a dose margin of the pattern formed on the surface is increased.

5. The method of claim 1 wherein a sensitivity to variation in $\beta_f$ is reduced, for the pattern formed on the surface.

6. The method of claim 1 wherein the calculating comprises charged particle beam simulation.

7. A method for manufacturing a surface using a charged particle beam lithographic process comprising a beam blur ($\beta_f$), the method comprising:
   determining a set of charged particle beam shots that will form a desired pattern on a surface by producing a charged particle dosage on the surface,
   wherein the determining comprises calculating a pattern formed on the surface, and wherein the calculating includes variation of $\beta_f$ due to Coulomb effect; and
   forming the pattern on the surface with the plurality of charged particle beam shots.

8. The method of claim 7 wherein the Coulomb effect for a shot in the set of charged particle beam shots depends on an area of the shot.

9. The method of claim 7 wherein shots in the set of charged particle beam shots comprise multi-beam shots, wherein each multi-beam shot comprises a number of beamlets, and wherein the Coulomb effect depends on the number of beamlets and the dosage of each of the beamlets.

10. The method of claim 7 wherein the determining comprises revising the set of charged particle beam shots such that a dose margin of the pattern formed on the surface is increased.

11. The method of claim 7 wherein a sensitivity to variation in $\beta_f$ is reduced, for the pattern formed on the surface.

12. The method of claim 7 wherein the calculating comprises charged particle beam simulation.

\* \* \* \* \*